US006839260B2

(12) United States Patent
Ishii

(10) Patent No.: US 6,839,260 B2
(45) Date of Patent: Jan. 4, 2005

(54) SEMICONDUCTOR DEVICE HAVING DIFFERENT TYPES OF MEMORY CELL ARRAYS STACKED IN A VERTICAL DIRECTION

(75) Inventor: Tomoyuki Ishii, Hachiouji (JP)

(73) Assignee: Hitachi, Ltd., Tokyo (JP)

( * ) Notice: Subject to any disclaimer, the term of this patent is extended or adjusted under 35 U.S.C. 154(b) by 258 days.

(21) Appl. No.: 09/764,487

(22) Filed: Jan. 18, 2001

(65) Prior Publication Data

US 2001/0017798 A1 Aug. 30, 2001

(30) Foreign Application Priority Data

Jan. 18, 2000 (JP) ........................................ 2000-013893

(51) Int. Cl.[7] ................................................ G11C 5/02
(52) U.S. Cl. ............................ 365/51; 365/63; 365/222
(58) Field of Search ............................ 365/51, 63, 72, 365/222

(56) References Cited

U.S. PATENT DOCUMENTS 5,719,633 A  * 2/1998 Nishio et al. ............... 348/441
5,815,441 A  * 9/1998 Kobatake ................. 365/185.29
6,632,706 B1 * 10/2003 Leedy ......................... 438/109

FOREIGN PATENT DOCUMENTS

JP        5-82787      4/1993    ......... H01L/29/784

OTHER PUBLICATIONS

IEICE Transactions, vol. E 74, pp. 130–141, 1991.
IEEE International Solid State Circuit Conference, pp. 266–267, 1996.
K. Yano et al., "A Room Temperature Single Electron Memory Device Using Fine–Grain Polycrystalline Silicon", IEDM 1993, pp. 541–544.

* cited by examiner

Primary Examiner—Andrew Q. Tran
(74) Attorney, Agent, or Firm—Antonelli, Terry, Stout & Kraus, LLP

(57) ABSTRACT

To provide a semiconductor memory device capable of fast rewriting with a small area, and/or large-capacity operation with a small area or fast operation and low power consumption operation, peripheral circuits such as logic circuit, buffer memory and sense circuit or part thereof are formed on a semiconductor substrate surface, and memory cells are provided thereon with an insulator film interposed therebetween.

8 Claims, 20 Drawing Sheets

SEMICONDUCTOR DEVICE HAVING DIFFERENT TYPES OF MEMORY CELL ARRAYS STACKED IN A VERTICAL DIRECTION

BACKGROUND OF THE INVENTION

The present invention generally relates to semiconductor memory devices and data processor devices.

As a conventional example concerning the present invention, there is a flash memory described in a document of IEICE Transactions, vol. E74, pp. 130–141, 1991, written by T. Masuhara et al. This flash memory cell has the source, drain and channel region formed on a silicon substrate surface, and the floating gate and control gate of polycrystalline silicon provided within an insulator. The memory function is achieved by charge accumulation within the floating gate and by use of the change of conductance between the source and drain due to the increase or decrease of the amount of accumulated charges. As another conventional example, a single-electron memory using polycrystalline silicon can be cited which is described in IEEE International Electron Circuit Conference, pp. 541–544, 1993, written by K. Yano et al, and International Solid-State Circuits Conference, pp. 266–267, 1996, written by K. Yano et al. This technology is that the channel as a current path and the electron capturing memory region are simultaneously formed by thin film of polysilicon. Storing of information can be performed by using the fact that the conductance of the current path is changed when an electron is captured by the memory region. In addition, the number of accumulated electrons can be controlled with high precision up to a single unit by accumulating electrons in minute memory regions, and the accumulated electrons can be stably held even at room temperature. This single-electron memory can be found, from its principle, to be suited for its extreme size reduction. Particularly by using an elemental structure having the source and drain regions provided on an insulator film, it is possible to reduce the conductance between the current path and the surroundings and thus read out information easily from a small amount of accumulated charges. Moreover, SRAM, as described in IEICE Transactions, vol. E74, pp. 130–141, 1991, written by T. Masuhara et al, can be cited which is an example of the memory cell having a combination of FET (Field Effect Transistor) of polycrystalline silicon and MOS (Metal-Oxide-Semiconductor) transistor provided on the substrate surface. The SRAM in which a unit memory cell is formed as one set of six transistors uses polycrystalline silicon FET for two transistors that serve as load. Since the polycrystalline silicon FET can be formed on other transistors, the memory cell can be built in a smaller area than when six transistors are formed on the substrate surface.

Also, EPROM formed of polycrystalline silicon is known which is described in JP-A-05-082787 as an example of nonvolatile semiconductor memory having a channel on an insulator.

The semiconductor memory device that stores information by accumulating charges in storage regions within an insulator and using the change of conductance between the source and drain due to the increase or decrease of the accumulated charges, as represented by flash memory, has memory cells each formed of one transistor, and thus it is suited for its high-density integration. The flash memory has the merit of high-density integration and nonvolatile property, but it is three digits or more slower to rewrite than DRAM. Therefore, as in digital cameras, data is once stored in a volatile memory for buffer, and then gradually transferred to a nonvolatile element. Thus, since this technique needs to provide a buffer memory as a separate chip and use a complicated control system, the cost is greatly increased as compared with the case in which only a flash memory could be used. A register is provided for each data line on the flash memory chip. It can be considered to divide the data line and increase the number of registers, thereby raising the rewriting speed. However, since the register occupies a large area, the chip area would be increased, and thus the cost still rises.

In addition, if the capacitance of data line is reduced simply from the view point of improving the performance of semiconductor memory devices, the time necessary for charging and discharging is short at the time of writing, erasing or reading. Thus, such a device is suited for high-speed operation, and can operate with low consumption power because of a small amount of charges to be charged or discharged. This is true for word lines. On the other hand, the memory cell array region is still needed to expand in its area with the great increase of memory capacity even though the very small size capability is taken into consideration. Therefore, the data lines and word lines run between the ends of the array would become long, thus increasing their capacitance. A counter-measure for solving this problem can be used to divide the cell array into smaller units, and write or read for this unit. However, if peripheral circuits such as a sense amplifier and word line driving circuit are provided for each small unit, increase of the memory area will occur as a new problem.

Moreover, for cost reduction and improvement in speed of data transfer between memory and processor, the DRAM and flash memory should be designed to be on a single chip for the effective means. However, because the memory cell production process and the logic-purpose CMOS production process are not matched well with each other, it is difficult to combine both the memory performance and the logic performance.

SUMMARY OF THE INVENTION

Accordingly, it is an object of the invention to provide a semiconductor memory device capable of fast rewriting with little increasing of the memory area. In addition, it is another object of the invention to provide a data processor device capable of being easily produced and mounting a large-scale memory on the same chip with the logic performance not lost.

The inventors have created an idea that, for constructing both CMOS circuit and memory such as DRAM, SRAM or flash memory on a chip, the CMOS circuit is built on the semiconductor substrate surface for its fast operation because of small dispersion of performance and great mobility while the memory portion is built on the insulator film because it is easy to separate between elements so that a small-area memory cell can be constructed to be suitable for high-density integration. In addition, the inventors have considered that, even in a semiconductor memory device having two or more hierarchically configured memories within a chip, fast memories are built on the semiconductor substrate surface, while the memories that are relatively slow in writing and reading are built at a high density on the insulator film.

The present invention is featured in that peripheral circuits such as a buffer memory and sense amplifier or part thereof are provided on the semiconductor substrate surface, while memory cells are formed thereon with an insulator film provided therebetween.

More specifically, a semiconductor memory device or data processor device of a typical embodiment of the invention has two or more different memory cell arrays formed on a single chip, of which at least two different arrays are provided up and down, respectively.

An embodiment of the invention that is capable of being easy to produce and mounting a large-scale memory on a single chip without losing the logic performance is as follows. There is provided a semiconductor memory element, or cell having at least one memory region surrounded by a potential barrier. It has source and drain regions provided on an insulator film, and connected together through a semiconductor, and it also has a control electrode. When a voltage is applied between the control electrode and the source, drain, charges are injected into the memory region or the memory region is forced to discharge so that storing of information is performed by use of change of conductance between the source and drain due to the increase or decrease of the amount of charges accumulated in the memory region. A plurality of such semiconductor memory elements are arrayed in a matrix. In addition, a plurality of transistors are provided on a substrate surface so that the matrix-arrayed semiconductor memory elements and the plurality of transistors are substantially and partially positioned up and down, respectively.

BRIEF DESCRIPTION OF THE DRAWINGS

FIG. 2a is a diagram for explaining the reduction of cost, and FIG. 2b is a diagram for explaining the increase of operation speed.

FIG. 15a is a perspective view thereof, and FIG. 15b is a cross-sectional view thereof taken along a data line.

FIG. 19a is for dispersion storing of certification information, and FIG. 19b is for dispersion storing of certification program.

DESCRIPTION OF THE EMBODIMENTS

Embodiment 1

Figure 2A:
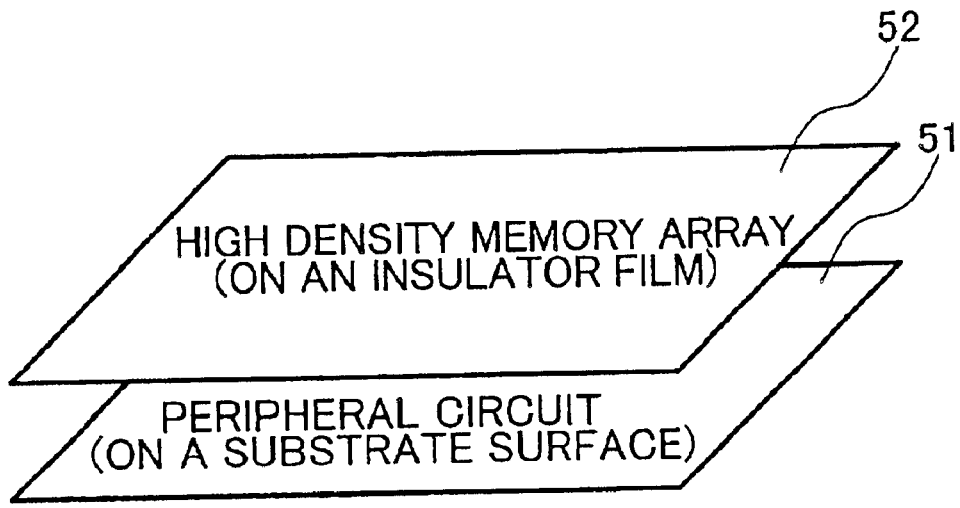
FIGS. 2a and 2b are conceptual diagrams for explaining the structure of the semiconductor memory device or data processor device according to the invention.

We shall describe a memory device or data processor device of the first embodiment according to the invention. FIGS. 2 are conceptual diagrams of a memory array portion of the memory device. As shown in FIG. 2a, a peripheral circuit 51 such as a sense amplifier and driver is built on a silicon substrate surface, and a memory cell array 52 is provided thereon with an insulator film interposed therebetween. According to this construction, a small-area memory device can be produced as compared with the case where the memory cell array and the peripheral circuit are formed on the same plane. Also, this construction is suited for fast operation because the memory cell array and the peripheral circuit can be connected by short conducting lines. The memory cell array on the insulator film is not limited to semiconductor memories, but may be memories made of other materials such as MRAM (magnetic random access memory). The MRAM stores information by utilizing a phenomenon that the resistance of a conductor which consists of stacked two magnetic films changes or a tunnel current between the magnetic films changes, when the magnetization directions of the magnetic films are parallel or anti-parallel.

Figure 2B:
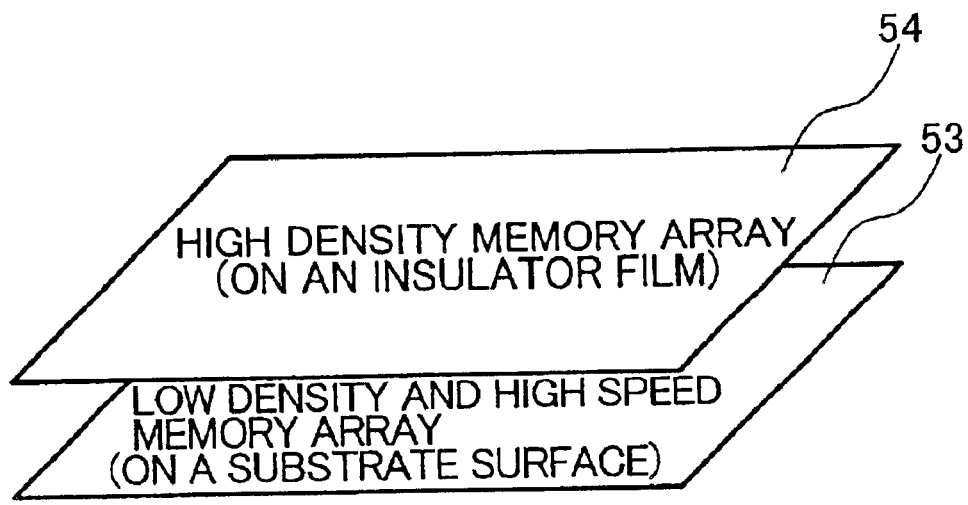

FIG. 2b shows a construction suited for the rewriting speed of memory cell array to be increased. In general, a memory that is excellent in high density integration, such as flash memory or DRAM, has a small cell size, but is slow in writing or reading operation speed. Particularly, a nonvolatile memory as typified by flash memory needs a long time for its writing or erasing. Thus, it is a general practice to once store information in a buffer memory capable of fast rewriting (for example, SRAM) and then transfer the information from the buffer memory to a flash memory where it is written. According to this construction, a memory cell array 53 capable of fast rewriting is formed on the substrate surface, and a memory cell array 54 is built on an insulator film at a higher integration density than the memory cell array 53 formed on the substrate surface. Since the fast-rewritable memory cell array 53 is formed at a lower integration density and has a smaller capacity than the memory cell array 54, it can be constructed in a three-dimensional manner relative to the high-density integrated memory cell array 54. Therefore, the area for the arrays can be decreased as compared with the case in which the high-density integrated memory cell array 54 and the fast-rewriting memory cell array 53 are built in a row on the same plane.

Figure 1:
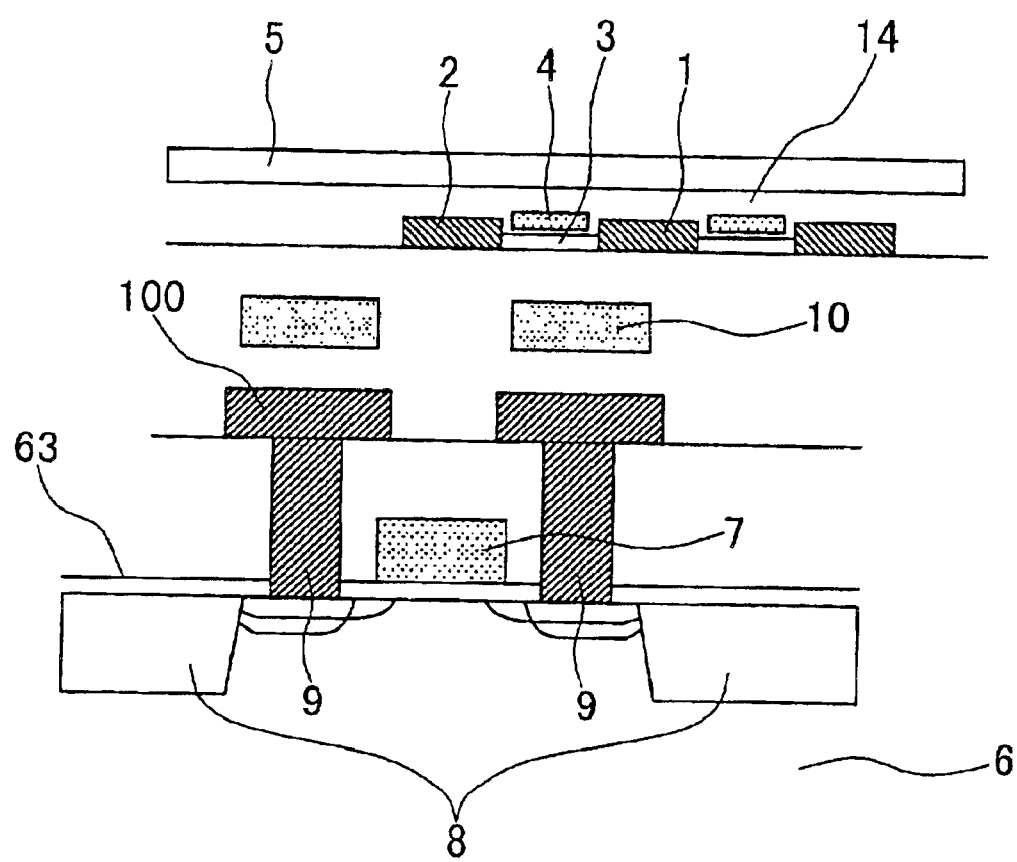
FIG. 1 is a diagram showing the structure of a semiconductor memory device according to the invention.

FIG. 1 is a cross-sectional view of such a three-dimensional memory cell array. Referring to FIG. 1, on a semiconductor substrate surface there are formed transistors that constitute a peripheral circuit or memory cell array capable of fast rewriting. In addition, a flash memory is built as memory cells (called upper memory cell) on an insulator film. A source region (source line) 1 and drain region (local data line) 2 made of 50-nm thick, highly-doped n-type polycrystalline silicon are connected by a channel 3 of 10-nm thick, low-concentration polycrystalline silicon. An insulator film is formed on the source region 1, the drain region 2 and the channel 3. A floating gate 4 of 20-nm thick, n-type polycrystalline silicon is surrounded by the insulator film. A control gate (word line) 5 of n-type polycrystalline silicon lined with tungsten is further provided over those regions.

For information storing operation, when a large positive voltage ((for example, 20 V) or negative voltage (for example, −18 V) is applied between the source and drain, charges are moved through an 8-nm thick tunnel insulator 11. Reading operation is performed by utilizing the fact that the threshold voltage of a transistor that is formed of the gate 5, source 1, drain 2 and channel 3 changes depending upon the amount of charges within the floating gate 4.

Figure 4:
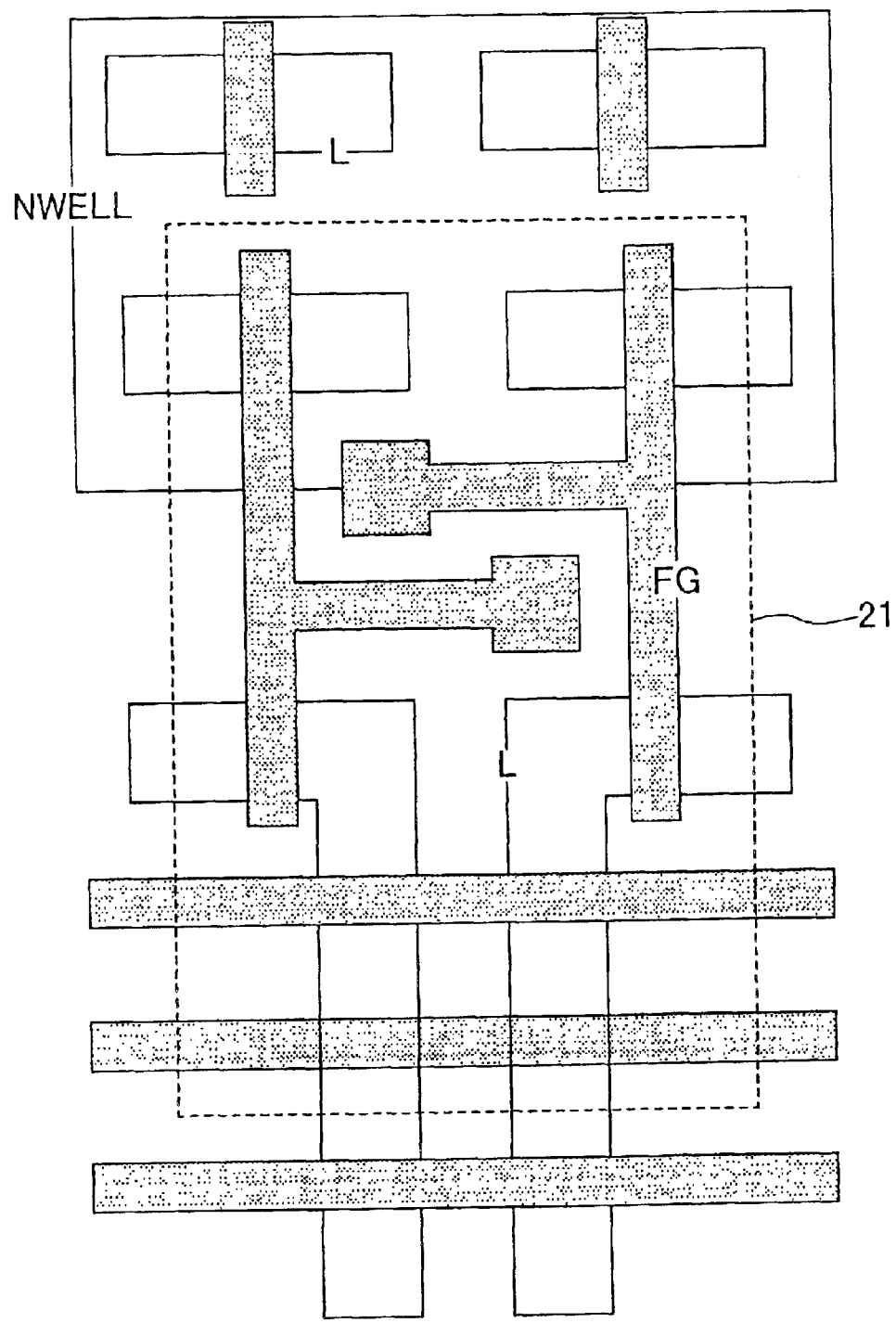
FIG. 4 is a layout for explaining the manufacturing process of the semiconductor memory device according to the invention.

The manufacturing process for the memory cell array of this embodiment will be described below. FIGS. 4 through 7 are layout diagrams showing the process for producing one SRAM cell and a flash memory cell array thereon. In FIG. 4, a SRAM cell is formed in a region 21 surrounded by the dotted line. An n-type well NWELL is formed by implanting phosphor into a p-type silicon substrate and heating the substrate. Then, a p-type well is formed in the n-type region by implanting boron into this well and heating it. There is an advantage that the p-type regions isolated in the n-type region can be placed at a different potential. The transistors are built in those formed n-type well and p-type well.

Then, the substrate is etched (pattern L) through a photoresist mask, and an $SiO_2$ film is buried in this groove, and flattened by etching so that isolation regions 8 can be formed. This isolation can be performed by another process such as LOCOS, or by covering the active region with an $Si_3N_4$ film and then oxidizing the substrate. Then, the substrate surface is oxidized to a thickness of 15 nm to form a gate oxide film 63 (FIG. 1). The gate oxide film is partially covered with photoresist or the like and etched away. After removing the cover, the substrate is again oxidized to form a 5-nm thick gate oxide film. This process is used to form transistors of thick and thin gate oxide films. For example, the transistor of thick gate oxide film is used for the driver of the flash memory to which a high voltage is applied. The transistor the SRAM employs is of the thin gate oxide film type, and assures fast operation. A polycrystalline silicon film is further deposited thereon, and etched through a photoresist mask (pattern FG) to form a gate electrode 7.

Figure 3:
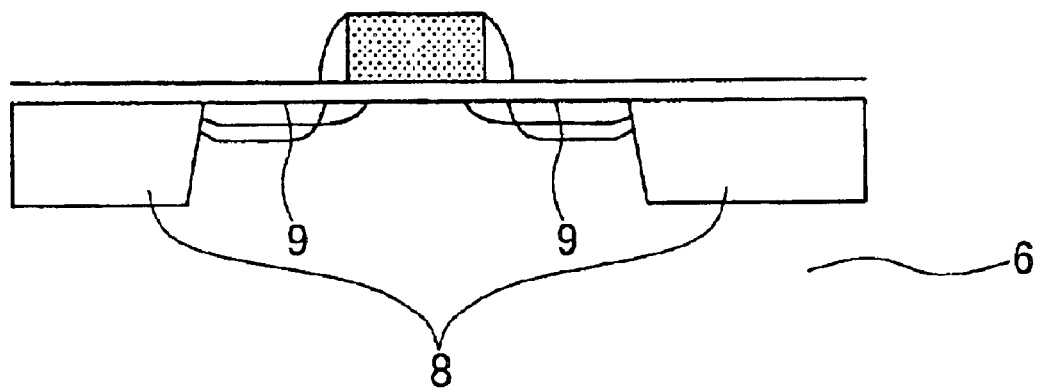
FIG. 3 is a diagram showing a memory cell, in the course of the manufacturing process, of the semiconductor memory device according to the invention.
Figure 5:
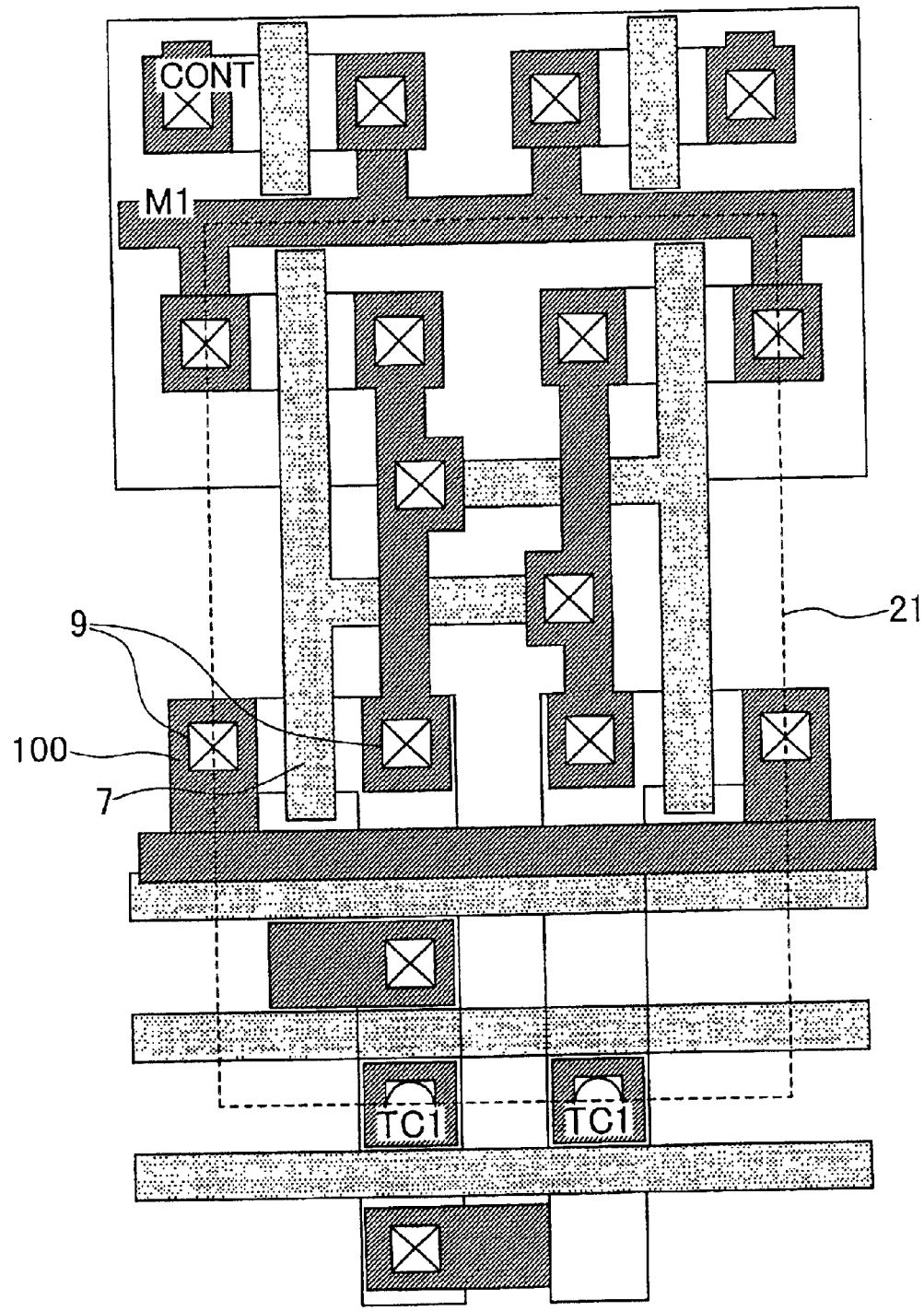
FIG. 5 is a layout for explaining the manufacturing process of the semiconductor memory device according to the invention.

Then, phosphor is implanted into the p-type well through a photoresist mask, and boron is implanted into the n-type well through a photoresist mask. Thereafter, an $SiO_2$ film is deposited thereon, and etched so that a side wall of $SiO_2$ is formed on the gate electrode. FIG. 3 shows this situation. Moreover, phosphor is implanted into the p-type well through a photoresist mask, and boron into the n-type well, thus producing a diffusion layer. Then, an $SiO_2$ film is deposited thereon, and flattened by CMP (chemical mechanical polish). In addition, a contact hole 9 is provided therein through a photoresist mask (pattern CONT), and tungsten W is deposited thereon. The tungsten film is etched through a photoresist mask (pattern M1) to form a wiring conductor pattern 100. An $SiO_2$ film is further deposited thereon, and flattened by CMP. Then, a contact hole for the connection to the first layer wiring pattern 100 is formed through a photoresist mask (pattern TC1), and tungsten W is selectively grown thereon. FIG. 5 shows this situation.

Figure 6:
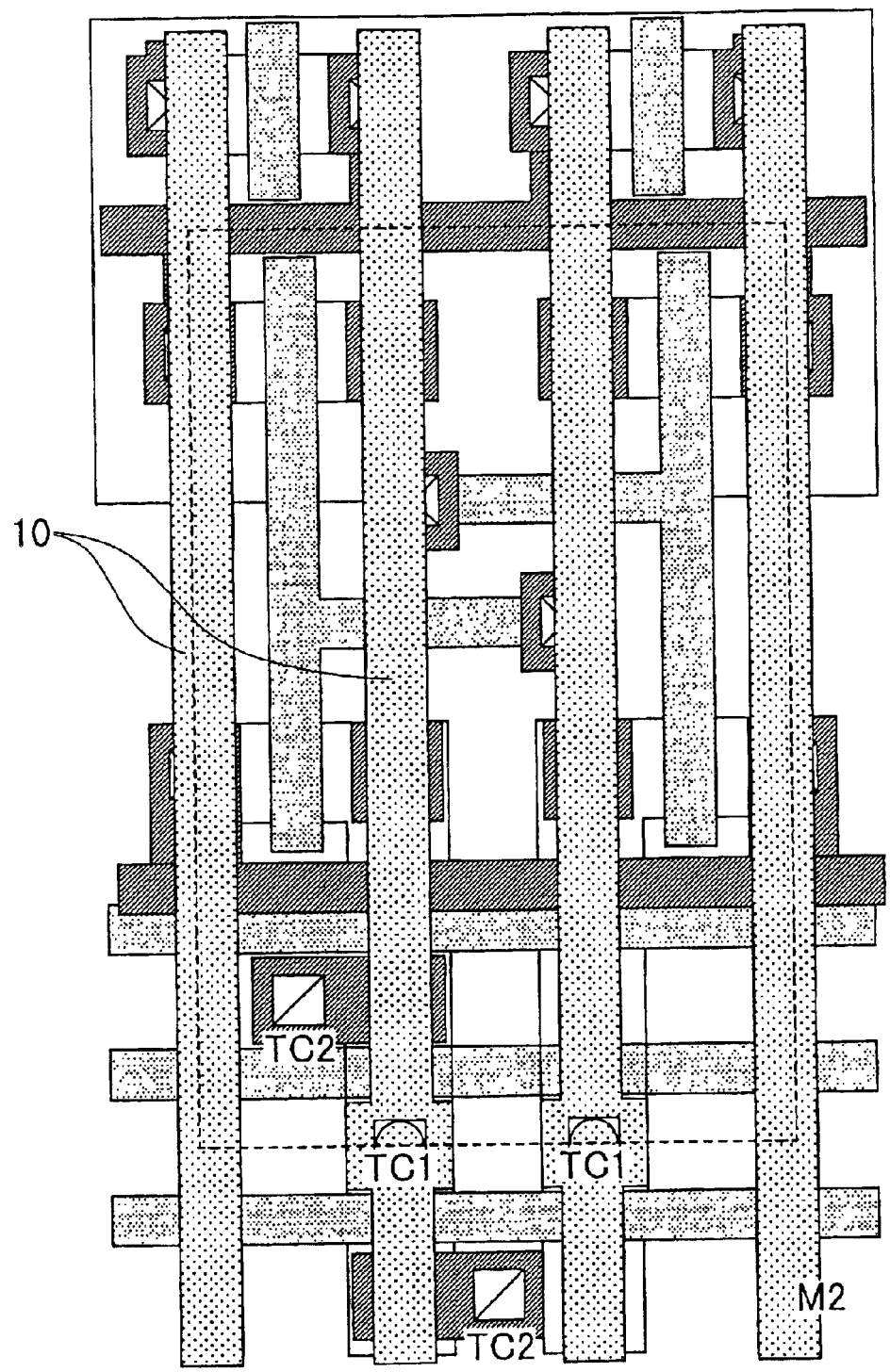
FIG. 6 is a layout for explaining the manufacturing process of the semiconductor memory device according to the invention.

Tungsten W is further deposited thereon, and etched through a photoresist mask (pattern M2) to form a second layer wiring pattern 10. The global data line is made of this layer. Then, an $SiO_2$ film is deposited, and flattened by CMP. A contact hole for the connection between the second layer wiring pattern (global data line) 10 and the wiring pattern (data line 1) located thereon is formed in the oxide film through a photoresist mask (pattern TC2), and tungsten W is selectively grown. FIG. 6 shows this situation.

Figure 7:
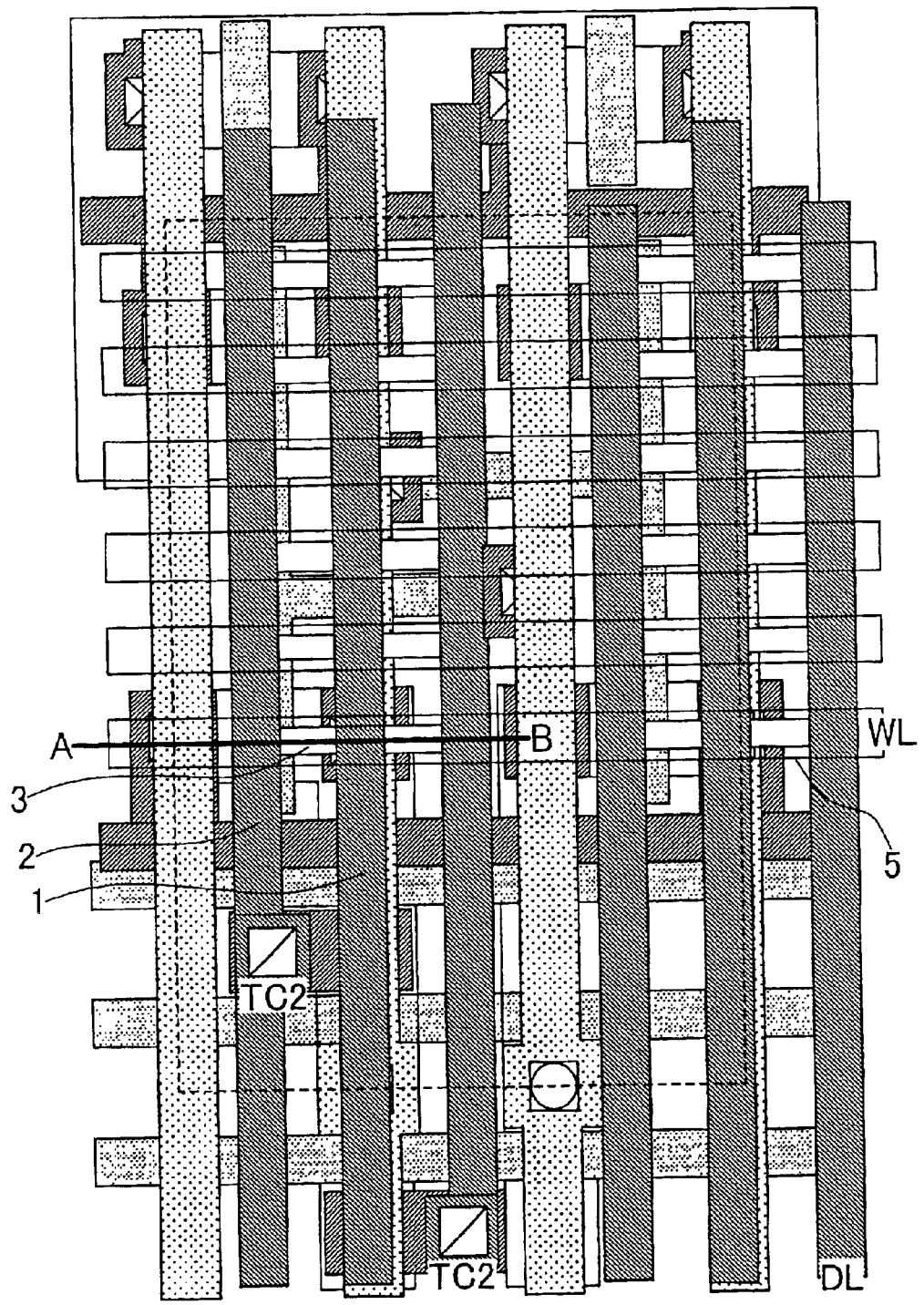
FIG. 7 is a layout for explaining the manufacturing process of the semiconductor memory device according to the invention.

In addition, an 50-nm thick n-type polycrystalline silicon film is deposited, and etched through a photoresist mask (pattern DL) to form data line 1 and source line 2. FIG. 7 shows this situation. FIG. 1 is a cross-sectional view taken along a line A-B in FIG. 7. A 10-nm thick p-type polycrystalline silicon film is further deposited thereon, and etched through a photoresist mask to form channel 3. A 10-nm thick p-type polycrystalline silicon film is also deposited thereon, and etched through a photoresist mask to form the floating gate 4. A 12-nm thick $SiO_2$ insulator film 14, a 40-nm polycrystalline silicon film, and a 30-nm thick tungsten film W are also deposited. Subsequently, the tungsten film W and polycrystalline silicon film are etched through a photoresist mask (pattern WL) to form the word line 5. An $SiO_2$ film is further deposited, and flattened. A contact hole is formed in the film through a photoresist mask, and TiN (titanium nitride) and Al (aluminum) are deposited thereon. The metal layers are etched through a photoresist mask to form a wiring pattern.

Here, since the polycrystalline silicon film of the channel of the flash memory is as thin as 10 nm, short channel effect is weak so that scaling-down is possible. Also, the channel may be intrinsic with no impurity introduced, because off state can be attained by complete depletion of the channel. The local data line may be made of metal. It is difficult to use a common process for creating both flash memory and MOS device at a time. Those flash memory and MOS device are usually produced by separate processes. The SRAM and peripheral circuit except a high-voltage driver circuit can be simultaneously produced. In addition, the memory cells formed on the insulator film are easy to isolate. Therefore, the number of manufacturing processes according to the invention does almost not increase as compared with that of the conventional flash memory production processes.

Here, tungsten W is used as a wiring material before the flash memory is formed on the upper layer because it has great resistance to heat in the processes for polycrystalline film production and impurity activation. Other high-melting point materials such as TiN or Ta (tantalum) may be used. The wiring material for the upper layer after the flash memory production may be aluminum Al. The Al wiring conductor could decrease the cost.

Figure 8:
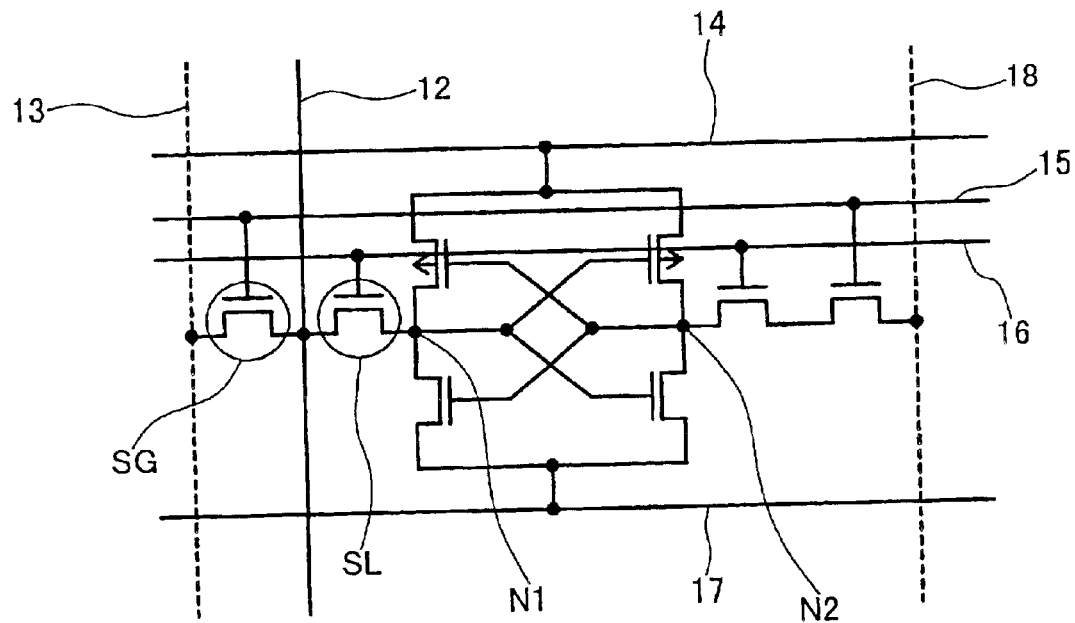
FIG. 8 is a circuit diagram of a SRAM portion formed on the substrate surface of the semiconductor memory device according to the invention.
Figure 21:
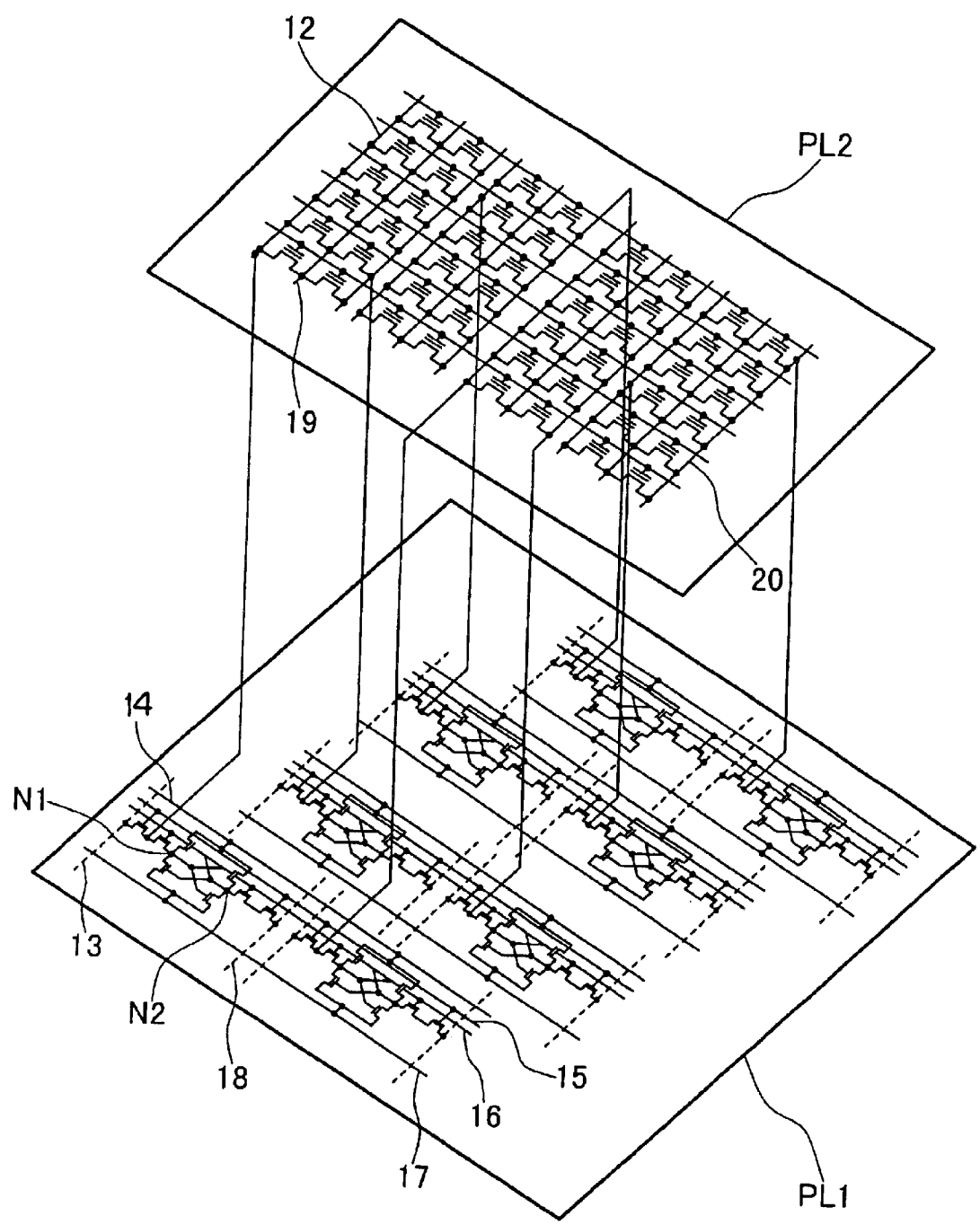
FIG. 21 is a circuit diagram of the invention.
Figure 22:
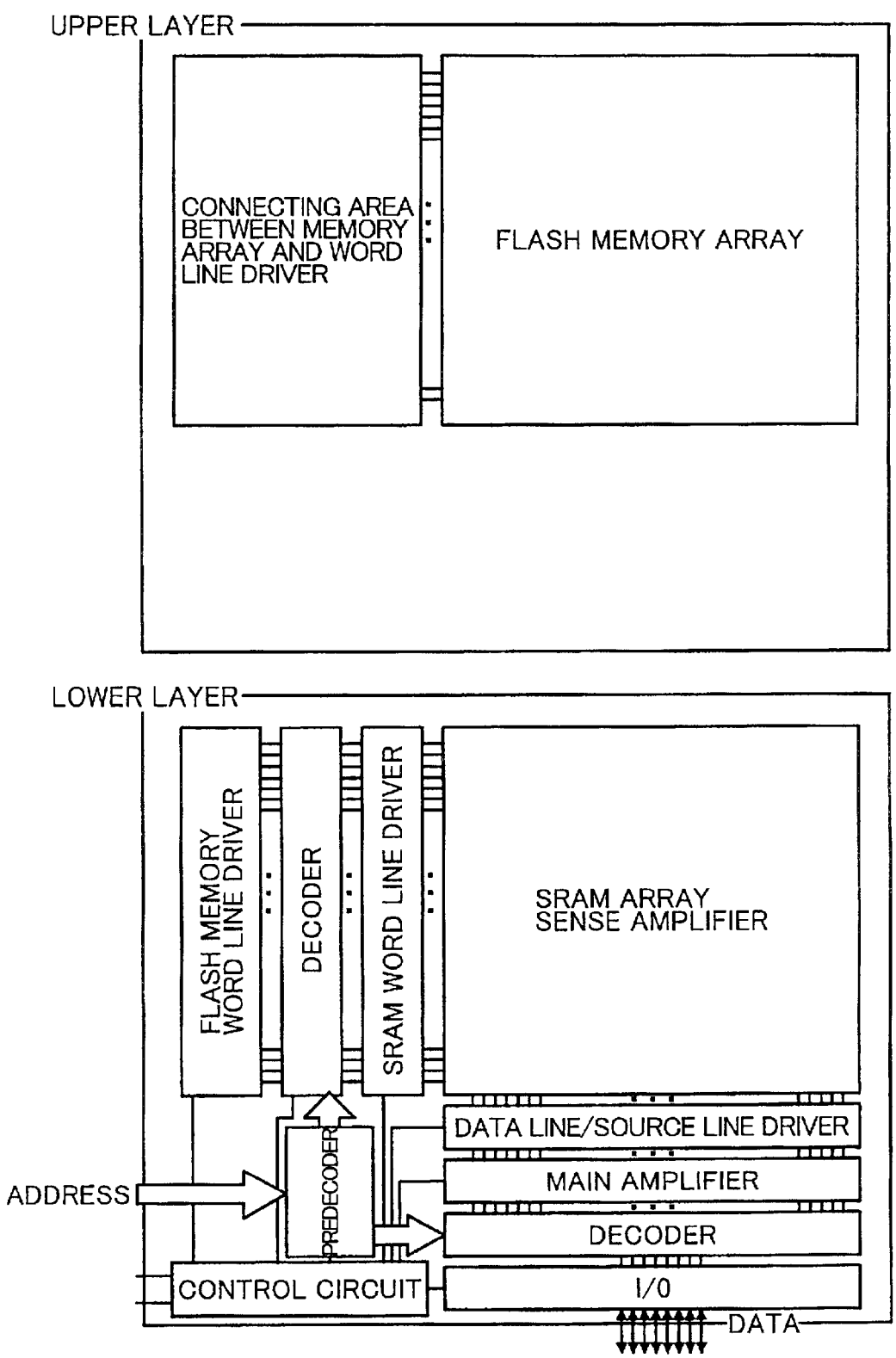
FIG. 22 is a block diagram of the semiconductor memory device according to the invention.

FIG. 22 is a block diagram of a memory device according to the invention. FIG. 21 shows the relation between the coupled flash memory and SRAM array illustrated in FIG. 22. FIG. 8 shows the SRAM cell of FIG. 21. On the substrate surface (lower layer) is provided a cell array whose unit cell has a SRAM (static random access memory) cell, a connection switch (SL) relative to the local data line and a connection switch (SG) relative to the global data line. The divided local data lines connected to a global data line are respectively connected through connection switches (SG) to the global data line.

Figure 11:
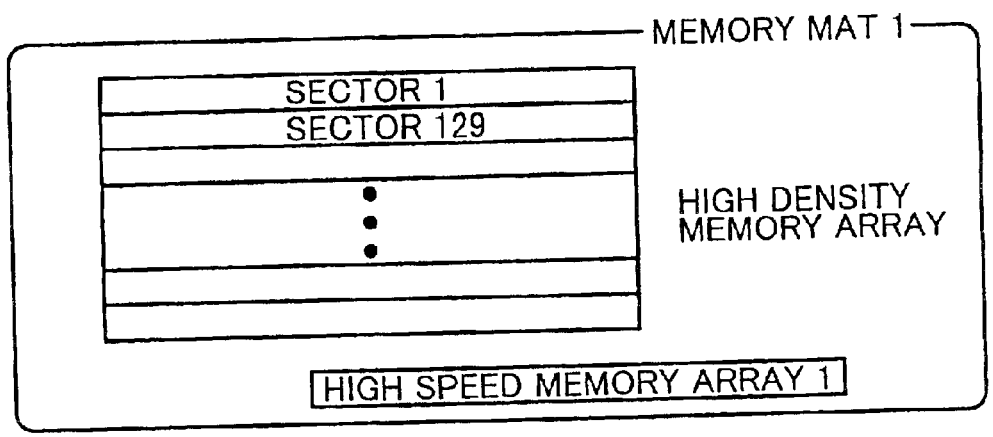
FIG. 11 is a diagram for explaining the memory mat structure and sector allocation of the semiconductor memory device according to the invention.
Figure 11:
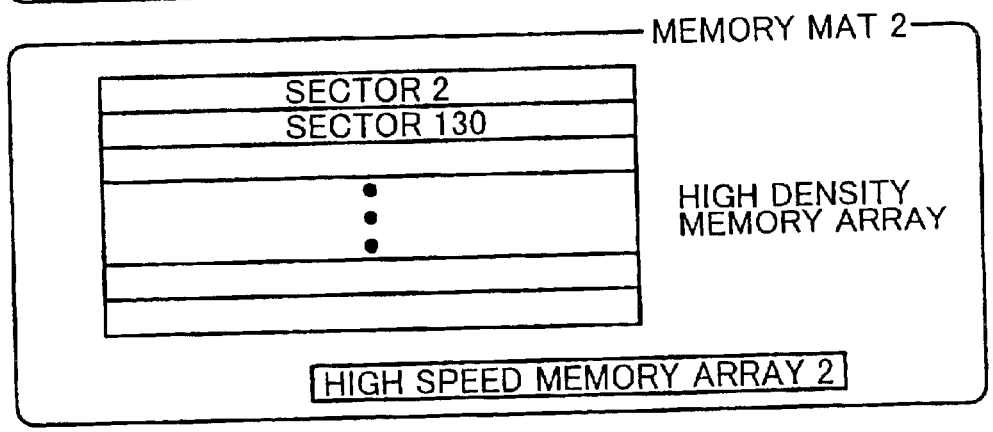
Figure 11:
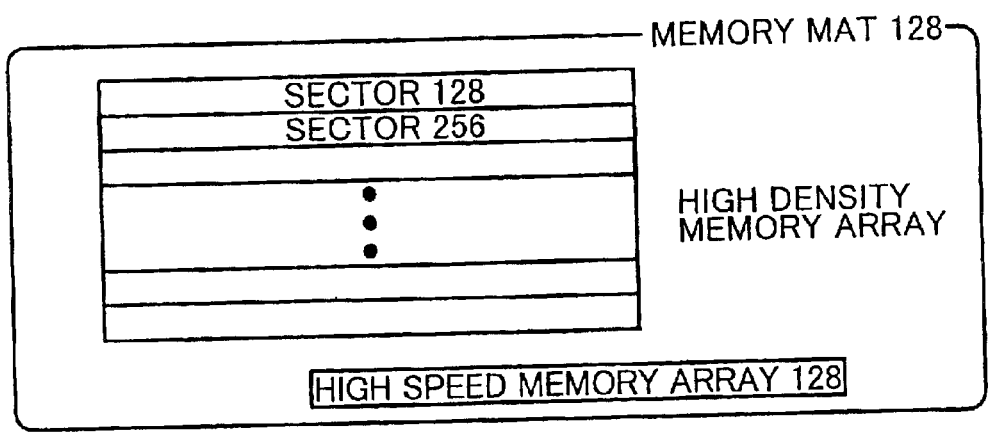
Figure 12:
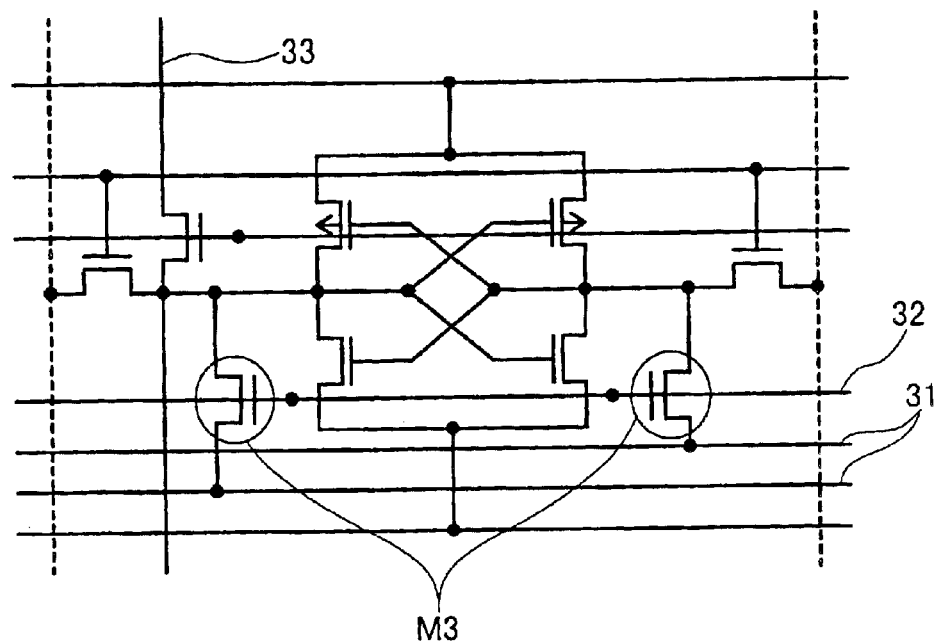
FIG. 12 is a circuit diagram for explaining the SRAM structure when the high-density integrated memory is volatile in the semiconductor memory device according to the invention.

In this embodiment, 128 local data lines are connected to one global data line. FIG. 11 briefly shows the divided lines. The high-density integrated memory (flash memory) is divided to have 128 cell arrays. Each cell array has a fast memory (SRAM) row provided thereunder. Here, this memory set is called memory mat. The local data line is connected within each memory mat, and the global data line connects the memory mats. The unit for writing or erasing is called sector, and driven by the same word line. In order to fast write or fast read, as described below, it is important to store a sequence of data in sectors of different memory mats. Therefore, as for example shown in FIG. 11, sequential sector numbers are allocated to different mats. It is possible to employ a system in which sector numbers are consecutively allocated within each mat, and a controller selects desultory sector numbers belonging to different mats in the writing mode. This embodiment in which the two switches SL, SG are connected in series to the SRAM cell is easy to take a small-area layout as compared with the embodiment 2 in which the switches are connected in parallel. Moreover, when the switch SL is turned off, and the switch SG on, the information within the flash memory can be transferred through the global data line to the outside without loosing the information held in the SRAM.

The operation of the memory device according to the embodiment of the invention will be described. First, in order to write information, it is necessary to load the information to a global data line 13. For example, information "0" and "1" are set to correspond to voltage 0 V and 5 V, respectively. Of course, reverse information is loaded to the other global data line 18 of the pair. At this time, the switches SL, SG are made conductive (on) relative to the desired local data line 12 and the SRAM cell connected thereto, and the switches SG to other local data line connected to the same global line are made nonconductive (off). The SRAM cell is turned on, and the loaded information is stored in the SRAM. After the lapse of time t1, the switch SG is turned off, and the next information to be written is loaded to the global data line 13. The loading and storing operations are performed for writing information in the SRAM, and can be made with a shorter cycle than the average writing time of the flash memory. On the other hand, the local data line 12 that is disconnected from the global data line 13 when the switch SG is made in the off state is kept to hold information to be high or low by the SRAM cell. Therefore, information can be written in the flash memory by turning off the switch SL, and setting the source line to be at a higher voltage (for example, 5 V) than this low voltage and by applying a writing voltage (for example, 20 V) to a word line 20 of the flash memory. In this case, when the loaded voltage is 5 V, the relative potential difference between the word line 20 and the data line 12 is 15 V. The relative potential difference, when the loaded voltage is 0 V, is smaller than 20 V. Thus, the tunnel current is small, and the threshold voltage is relatively low. After the switch SL is turned off, the SRAM may be made in the off state. The operation for writing in the flash memory can be finished by the time when the local data line 12 is again selected.

This embodiment employs a system for writing information by sequentially selecting 128 local data lines. Therefore, the operation for writing in the SRAM can be made two digits faster than that in the flash memory, thus fast rewriting being realized. Particularly when cell information erasing operation is made before writing, it is necessary to make erasing and writing consecutively, thus a long time being taken. Therefore, the effect of the invention is great.

In the reading mode, the global data line 13 is first precharged, and the switches SL and SG are turned on so that the local data line 12 is precharged. At this time, the global data line 13 connected to the local data line 12 is set to be at a higher potential than the other part, or global data line 18, of the pair. The switch SG is turned off, setting the source line 19 of the flash memory be at a lower potential (for example, 0 V) than the precharge voltage, and the word line 20 to be at a reading voltage. This reading voltage is made to be higher than the low threshed voltage of the memory cell but lower than the high threshold voltage. When the SRAM is made on a predetermined time after, the SRAM serves as a sense amplifier so that primary reading of information can be performed. In this case, when the potential of the local data line is made high at the time of writing, the threshold voltage of the flash memory is low, and thus a large current flows. As a result, the potential of the local data line 12 suddenly lowers. When the potential of the data line is made low in the writing mode, the potential of the local data line 12 slowly changes. Therefore, there is a timing for satisfying the following condition.

(Potential of node N1 for writing at high potential)<(potential of node N2)<(potential of node N1 for writing at low potential)

Here, the sense amplifier is designed to start. After the primary reading, the switch SG is turned on so that the result of reading is loaded to the global data line 13. If necessary, it may be amplified by an externally provided sense amplifier. In this case, the voltage information at the time of reading data is just the reverse of that at the time of writing. Thus, when data is transferred to the outside, it is reversed and transmitted to the outside. In the writing mode, the reversed information may be written. When the source line 19 of the flash memory is set to be at a higher potential than the precharge voltage in the reading mode, the node potential condition in magnitude is reversed relative to the above-mentioned case, and data can be read under the same node potential condition in the writing mode. Here, since the primary reading operation is performed in the local data line level after recharging the global data line, a plurality of local data lines that are driven by the same global data line simultaneously make the operation. That is, even if a long time is taken for the amplifying operation at the unit local data line level, the load to the global data line is the reading from the SRAM, and thus fast reading can be performed, or the data transfer rate is increased. Particularly in this embodiment, since the local data lines are made of polycrystalline silicon, the resistance is higher than that of the metal wiring conductor so that reading at unit cell level tends to take a long time. Use of the structure of this embodiment will make it possible that the data transfer rate of the whole memory chip is increased as compared with that of the normal flash memory chip. While the voltage sense reading system not using any dummy memory cell is used in this embodiment, other reading systems such as dummy cell system and current sense may be used. Moreover, while the SRAM in this embodiment serves both as the buffer memory at the time of writing information, and as the primary sense amplifier at the time of reading information held in the flash memory, the SRAM may serve as any one of these functions.

Embodiment 2

Figure 9:
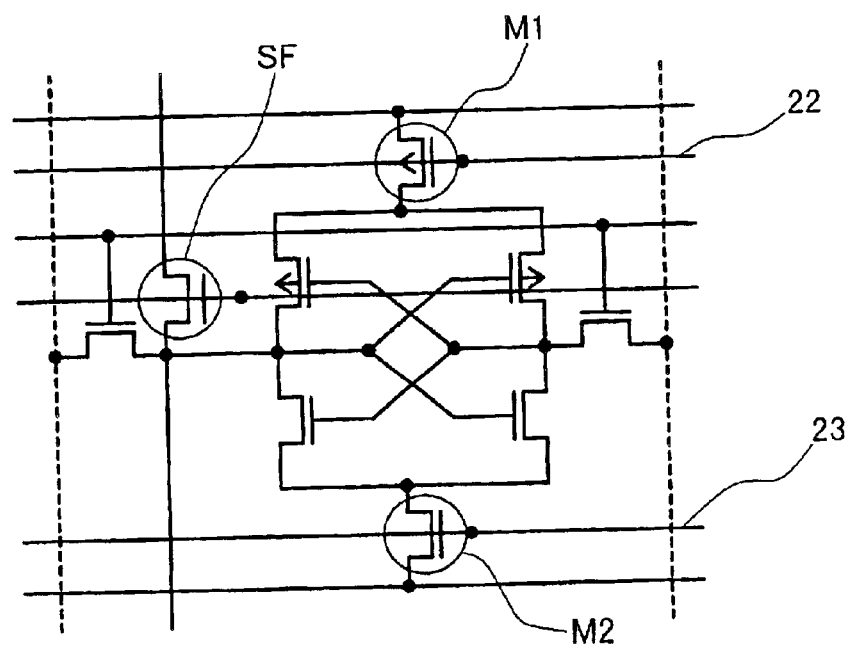
FIG. 9 is a circuit diagram of a SRAM portion formed on the substrate surface of the semiconductor memory device according to the invention.
Figure 10:
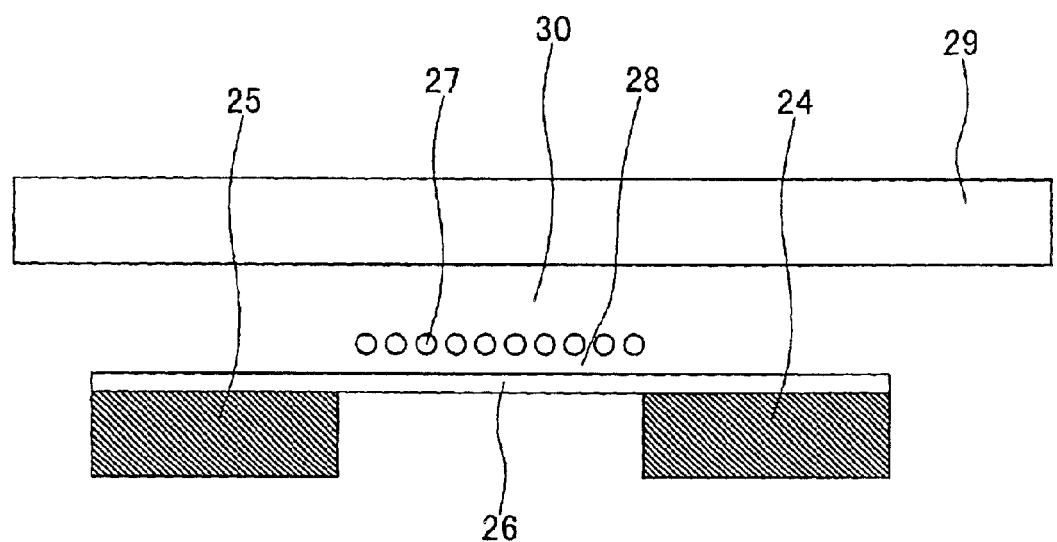
FIG. 10 is a cross-sectional view of a unit cell of a high-density integrated memory portion of the semiconductor memory device according to the invention.
Figure 13:
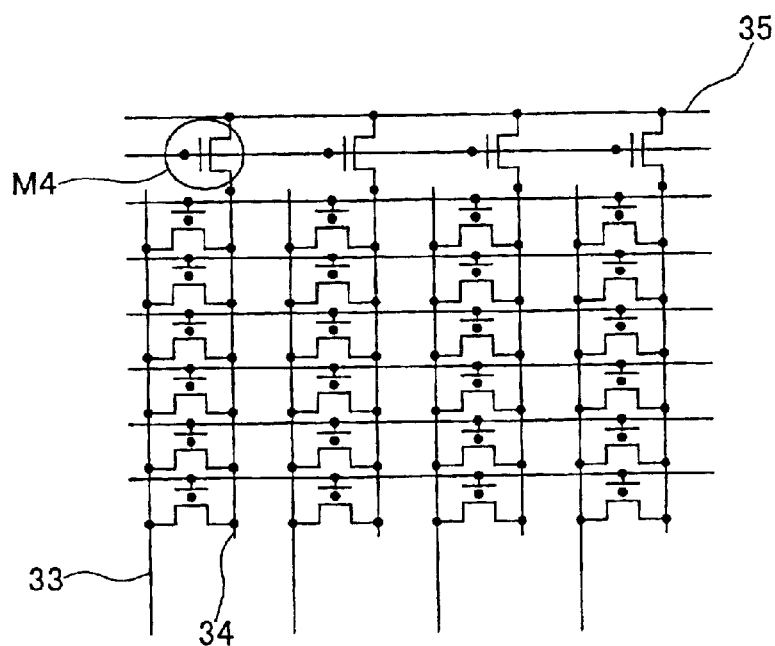
FIG. 13 is a circuit diagram of the high-density integrated memory cell array of the semiconductor memory device according to the invention.

FIGS. 9, 10 and 13 show a memory device of another embodiment according to the invention. FIG. 9 is a circuit diagram of another arrangement of the SRAM cell illustrated in FIG. 8. FIGS. 10 and 13 are, respectively, a cross-sectional view of the memory and a circuit diagram of the cell array, of the flash memory portion in embodiment 1. The other portions than these constructions are the same as in embodiment 1. The difference between embodiments 1 and 2 will be described below.

In FIG. 9, a selection transistor SF is connected differently from the transistor SL shown in FIG. 8. When the transistor SF is in the off state, this arrangement is equivalent to that of normal SRAM. Thus, it can be used not only for the function of a buffer memory for a slower, high-density integration memory as in the embodiment 1, but also genuinely for SRAM such as a secondary cache. When the high-density integration memory is accessed, switching is made to the same operation as in the embodiment 1. In the case when information is written in the SRAM through the global data line, if the transistor SF is turned off, fast operation is possible because it is not necessary to charge the capacitance of the local data line. Moreover, the arrangement shown in FIG. 9 is different from that of FIG. 8 in that the cell includes on/off switches M1 and M2 for SRAM or sense amplifier. As in the embodiment 1, on/off transistors common to power lines 14, 18 are provided to turn on or off the SRAM or sense amplifier. This arrangement uses a smaller number of transistors than the embodiment 2 and does not need to use signal lines 22, 23 for those, thus occupying a smaller area. However, it takes a long time for charging and discharging and consumes much power. In the embodiment 2, since each cell has switches, the arrangement of this embodiment can fast and stably operate and consumes small power.

The memory cell shown in FIG. 10 will be described below. Low-resistance semiconductor or metal source line 24 and local data line 25 are connected together by a semiconductor thin film channel 26. Semiconductor or metal fine grains 27 of 3-nm in average diameter are provided near the channel at a density of $10^{12}$ per cm$^2$. In this embodiment, silicon minute pellets 27 are formed. A 6-nm thick SiO$_2$ film 28 with its surface nitrided is provided between the channel and the minute pellets. In addition, a 8-nm thick SiO$_2$ film 30 with its surface nitrided is provided over the silicon minute pellets, and a word line 29 of double layer structure made of n-type polycrystalline silicon and tungsten W is provided on the film 30. The voltages to be applied for the operation are the same as in the embodiment 1. Although the term, electron is hereinafter used as the carrier for the sake of simplicity, the carrier may be hole. The term, electron as the carrier is also used in the other embodiments. If the carrier is hole, the polarity of the voltages to be applied is reversed to the above case. In this memory cell, only one or several electrons are accumulated on a single minute pellet unlike the flash memory in which many electrons are accumulated on a single floating gate. A large number of such minute pellets are provided to constitute a unit cell. This memory structure has the feature that, since the accumulated electrons are dispersed, the accumulated electrons can be stably held even if rewriting of information is frequently repeated. Particularly when a flash memory or EEPROM is constructed on an insulator, an insulator film produced by CVD or by oxidizing the polycrystalline silicon surface is usually used for the tunnel insulator film between the channel and the charge accumulating node. Thus, as compared with the conventional flash memory produced by oxidizing the surface of a single crystalline silicon substrate, it is concerned that the reliability of the insulator film is significantly reduced. According to the device structure of this embodiment, even if part of the insulator film has a defect, the effect acts on only a small part, and thus the reliability can be held to be excellent. Therefore, the tunnel insulator film 28 can be made thin, and thus information can be fast rewritten. Moreover, since the number of accumulated electrons is small, it takes a short time for electrons to be injected or discharged, and thus information can be fast rewritten. In addition, since the pellets 27 are very small, its electrostatic potential is greatly changed by receiving only one electron. When a single electron is injected to the pellet at the time of writing, the probability that the next electron is injected therein is remarkably reduced. Therefore, the number of electrons to be injected can be controlled with high precision.

FIG. 13 shows the circuit arrangement of the cell array. Unlike the embodiment 1 in which the area per unit cell is reduced by using the source lines common to the neighboring cells, a source line 34 is independently used for each local data line 33, and also connected through a switch M4 to a source power line 35. In this embodiment, at the time of writing, the switch M4 is turned off, making the source line be floating. When the cell is conductive by the application of a writing voltage, the source line 34 is held at the same potential as the local data line 33. Thus, electrons can be injected in the pellets under the same voltage condition near the source line 34 and data line 33. This cell array structure is effective even in the flash memory.

The manufacturing process of this embodiment about data line is different from the embodiment 1 only in the high-density integration memory cell portion. After forming the pattern TC2, a 100-nm thick silicon oxide film SiO$_2$ is deposited, and the grooves of the local data line pattern are formed in the SiO$_2$ film by dry etching through a photoresist mask. A 200-nm thick n-type polycrystalline silicon film is deposited, and flattened by CMP to form the source line 24 and local data line 25. The 10-nm nondoped polycrystalline silicon 26 and a 10-nm SiO$_2$ film are deposited, and the SiO$_2$ film is wet-etched with hydrofluoric acid through a photoresist mask. Then, the SiO$_2$ film mask is selectively oxidized at ordinary temperature in O$_2$ plasma to form a channel. After wet etching of SiO$_2$ film, the SiO$_2$ film 28 is freshly deposited and nitrided in its surface. The silicon minute pellets 27 and SiO$_2$ film 30 are deposited and again nitrided in its surface, and then n-type polycrystalline silicon and tungsten W are deposited. Subsequently, dry etching with a photoresist mask is performed to form the word line 29.

While the embodiments 1 and 2 used a nonvolatile memory for a high-density integrated memory, a volatile memory may be used. If, for example, the tunnel oxide film 26 in the memory cell of FIG. 10, is made thin, the memory holding time can be shortened, and rewriting speed is increased. In this case, for holding information, it is necessary to periodically make refreshing for reading and rewriting of information. Even for refreshing operation, the arrangement of this invention is effective. That is, information is sequentially read from each word line within a memory mat (primary read out), and a writing pulse is applied to the word line. In order to make the refreshing operation independently for each memory mat, it is necessary to provide the precharge power line 31, signal line 32 and switch M3. Thus, refreshing can be made independently of the global data line. Since refreshing is made for local data line unit, the capacitance to be charged or discharged is small, and thus the power consumption is small. Moreover, when the source line is fixed at 0 V, information is reversed for each refreshing operation as described in embodiment 1. Therefore, a one-bit counter for counting the number of refreshing operations is provided, and when information is taken out, the read information and counter value are passed through an EXOR (exclusive OR).

The high-density integrated memory may be normal DRAM formed of one transistor and one capacitor. Since refreshing can be made for each memory mat unit, both short refreshing cycle and large-scale memory capacity are possible. Since information is not reversed for each refreshing operation, the above operation is not necessary. In addition, the reading operation for each local data line unit can be fast made because of small data line capacitance and low data line resistance.

Embodiment 3

Figure 14:
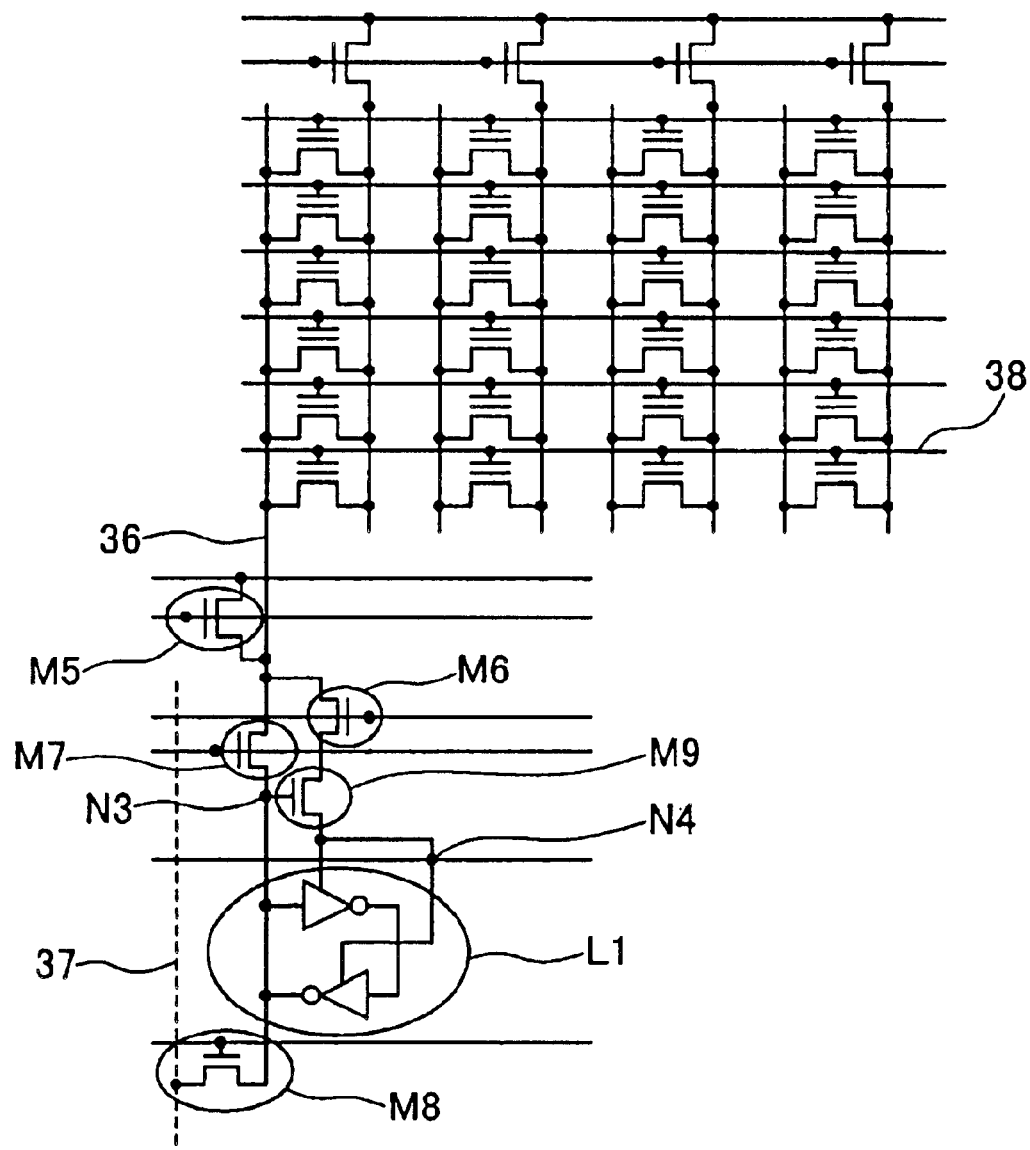
FIG. 14 is a verify circuit diagram of the high-density integrated memory cell array of the semiconductor memory device according to the invention.

FIG. 14 is a circuit diagram of the cell array portion of a memory device of another embodiment according to the invention. A flash memory is used for a high-density integrated memory. The interconnection of the high-density integrated memory cells is the same as in the embodiment 2. In this embodiment, unlike the embodiments 1, 2, erasing means the injection of electrons into the floating gate, and writing the extraction of the injected electrons. In addition, the high threshold corresponds to information "0", and the low threshold to information "1". In this embodiment, a verify circuit in addition to the sense/latch circuit in the embodiments 1, 2 is provided in each memory mat. The flash memory has a relatively large dispersion between devices about the writing and erasing characteristics as compared with DRAM and SRAM. The so-called verify operation is useful that verifies by reading after the application of write (erase) pulse, and forces the writing operation to be again performed for bits that have failed to write. The verify circuit is not limited to one shown in FIG. 14, but may be other circuits. Also, while verifying is made only for writing in this embodiment, verifying may be made for erasing. Verifying for erasing makes it possible to reduce the threshold voltage distribution before writing, and thus to shorten the time for verifying of writing. While the erasing can be defined by the low threshold as in the embodiments 1, 2, the verify circuit is necessary to change because voltage values are changed.

The verifying operation will be described with reference to FIG. 14. In the circuit arrangement of this embodiment, when "1" is written, writing is further performed for poor cell, reducing the threshold.

Step 1

Information to be desired to write is read from a global data line 37 and stored in a latch L1. After the reading-in, a transistor M8 is turned off so that the memory mat is disconnected from the global data line 37. The latch circuit may be SRAM shown in the embodiments 1, 2, or others. At the same time, a large positive voltage (for example, 18 V) is applied to a word line 38, making erasing operation so that electrons are injected into the floating gate. At this time, transistors M5, M6 and M7 are turned off.

Step 2

The transistor M7 is turned on, allowing data to be loaded to a local data line 36.

Step 3

A negative write pulse (for example, −15 V) is applied to the word line 38, making writing operation.

Step 4

The transistor M7 is turned off, and transistor M5 on, making the data line 36 be precharged to 0 V.

Step 5

The transistor M5 is turned off, and transistor M6 on. At this time, when the information held in the latch L1 is "1", node N3 is at high potential. When a transistor M9 is turned on, the voltage of high (5 V) at node N4 is loaded to the local data line 36. Moreover, when the information held in the latch L1 is "0", the transistor M9 is in the off state, and the local data line 36 is still at 0 V.

Step 6

The transistor M6 is turned off, setting the word line 38 to be at read voltage (for example, 1.5 V). When writing of information "1" is normally finished, the threshold voltage is lower than the read voltage. Thus, current flows in the memory cell, lowering the potential of the local data line 36. On the other hand, when writing of information "1" is inadequate, a small current flows in the memory cell, so that the potential of the local data line 36 is slowly changed.

Step 7

Therefore, when the transistor M7 is turned on at a predetermined timing, low state is latched if the writing is correct, or high state is latched if it is incorrect. In addition, when written information is "0", the precharge voltage is low (0), and the memory cell has high threshold. Thus, low state is latched. Then, the process goes back to (step 3).

Thus, when write voltage is again applied to the word line, a large negative voltage is applied between the data line 36 and word line 38 only for the case in which the writing of "1" is tried but insufficient. As described above, since the latch L1 connected to the cell in which correct writing has been performed is in the same state as when it stores information of "0", the end of this loop can be judged by deciding if the information in the associated latch in the memory cell driven by the same word line has all reached "0".

The width or voltage of the pulse to be applied to the word line at the verifying step (step 3) may be changed to accelerate the convergence or conversely control the threshold voltage with high precision.

Although division of data line has been chiefly described so far, the structure of the invention is also useful for the case in which the word line is divided. Even if a driver is provided for each section of the divided word line, the area penalty is small as in the data line division. Since the capacitance of the word line to be driven is reduced, all the operations of writing, erasing and reading can be fast performed.

Embodiment 4

Figure 15A:
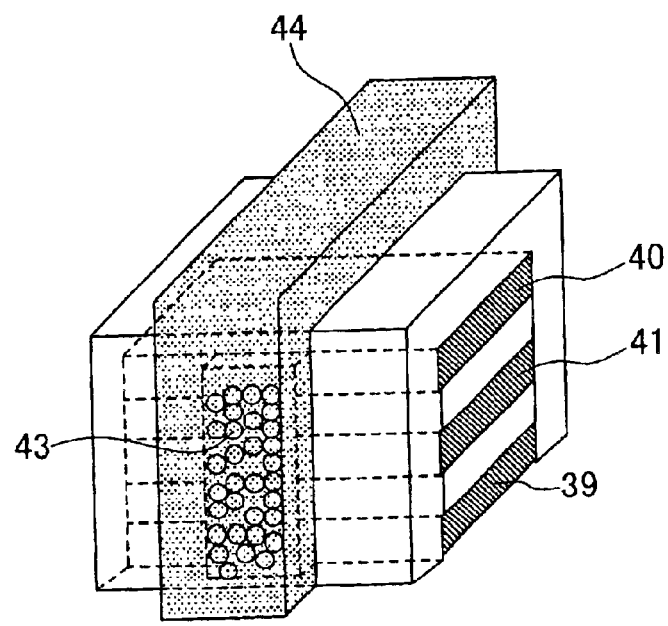
FIGS. 15a and 15b are diagrams for explaining the structure of the high-density integrated memory cell of the semiconductor memory device according to the invention.
Figure 15B:
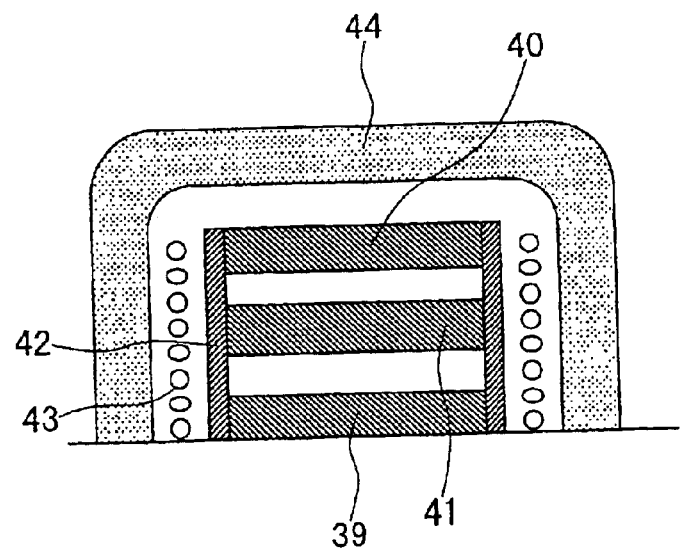
Figure 16:
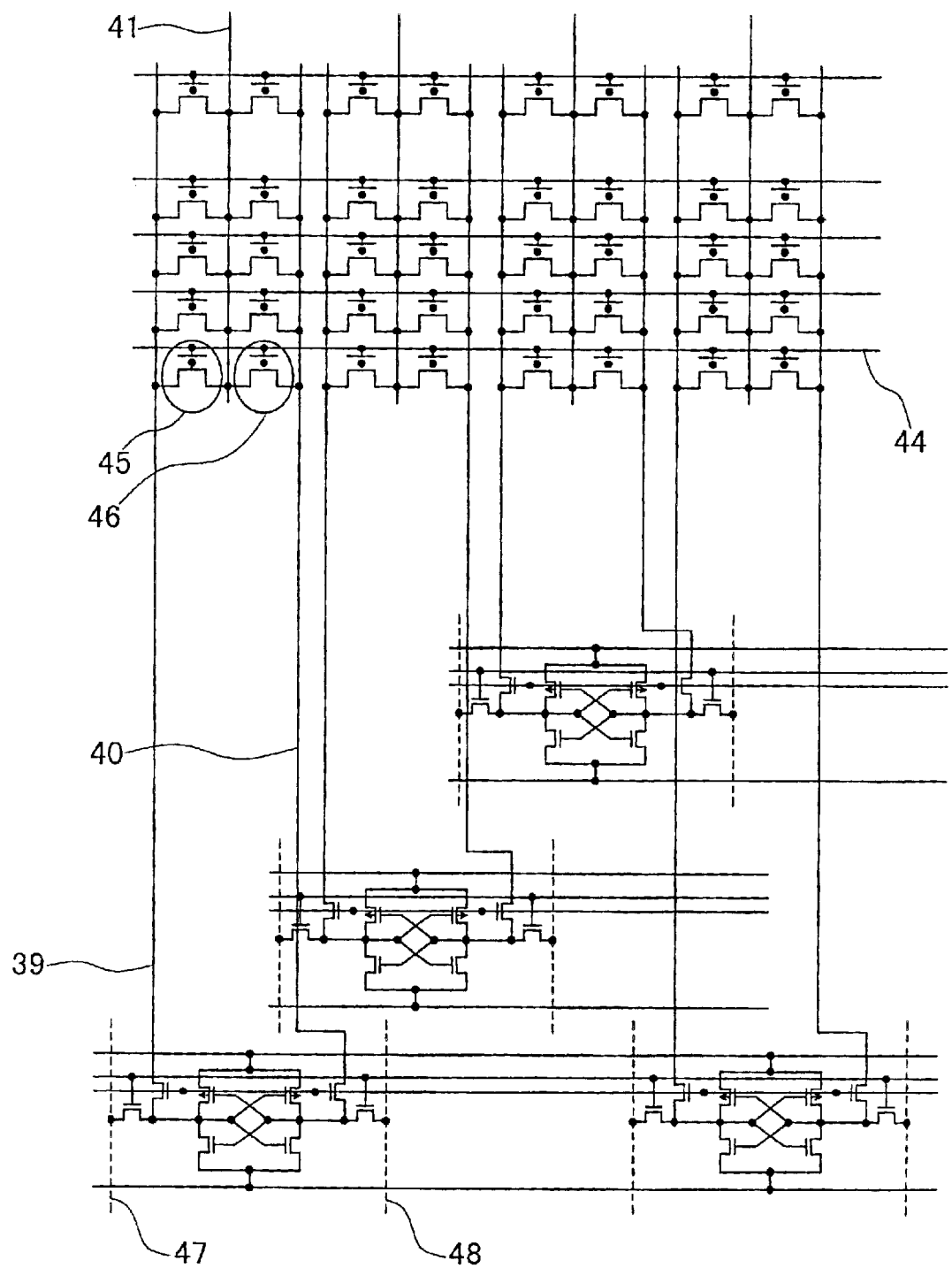
FIG. 16 is a circuit diagram of the memory cell portion of the semiconductor memory device according to the invention.

FIGS. 15a and 15b show a high-density integrated memory cell of the fourth embodiment according to the invention. FIG. 16 is a circuit diagram of the memory cell portion of this embodiment.

The principle of operation of the high-density integrated memory cell is the same as that of the memory cell (FIG. 10) of the second embodiment 2. However, it is different from the previous embodiments in that it has two local data lines, and takes a three layer structure of first local data line 39, source line 41, second local data line 40. A channel 42 is provided to be perpendicular to the substrate, and thus a charge accumulating region 43 made of semiconductor or metal minute pellets, and a word line 44 are provided to cover the sides of the channel. The three-layer structure has the source line common to the other layers, the lower cell using the first local data line 39 and the upper cell using the second local data line 40, both cells vertically piled up. The memory cell can occupy a small area. The channel 42 and charge accumulating regions 43 for the upper and lower cells have been deposited at a time, and have different roles depending upon the positional relation to the source line and local data lines.

The memory cell structure of this embodiment is fabricated at a very high integration density. However, if this structure were produced on a substrate surface as in the normal semiconductor memory, the peripheral circuit such as a sense amplifier could not be small-sized as much as the memory cell. Therefore, the ratio of the area of the peripheral circuit to the other portions would be increased, thus reducing the effect of using the low-area memory cell. If the super-high-density integrated memory cell and the peripheral circuit are formed in the vertical direction as in this embodiment, the small-area feature of this memory cell can be fully and effectively used. Moreover, if the local data lines 39, 40, even if they are made of a semiconductor or metal material, are formed to be thick, the level difference between the laminated data lines becomes great, thus making it difficult to work the channel or the word line. Accordingly, it is necessary to form them in a thin film. The result is that the resistance of the local data lines cannot be sufficiently decreased. In this embodiment, since each short local data line unit is driven, the operations of writing, erasing and reading can be fast performed though the resistance of the local data lines is not small.

FIG. 16 shows a structure using a common source line as in FIG. 3. However, the memory cell has a common source line, and the two cells to be driven by the same word line are laminated up and down. Also, in this embodiment, normal and inverted pieces of information are written in the upper and lower cells, and reading is performed while the information in the two cells are being compared. For storing of information, the margin is great, and thus stable storing operation can be made. While the cells in which normal and inverted pieces of information are written are provided in the vertical direction as in this embodiment, this embodiment is not limited to the way to provide.

Embodiment 5

Figure 17:
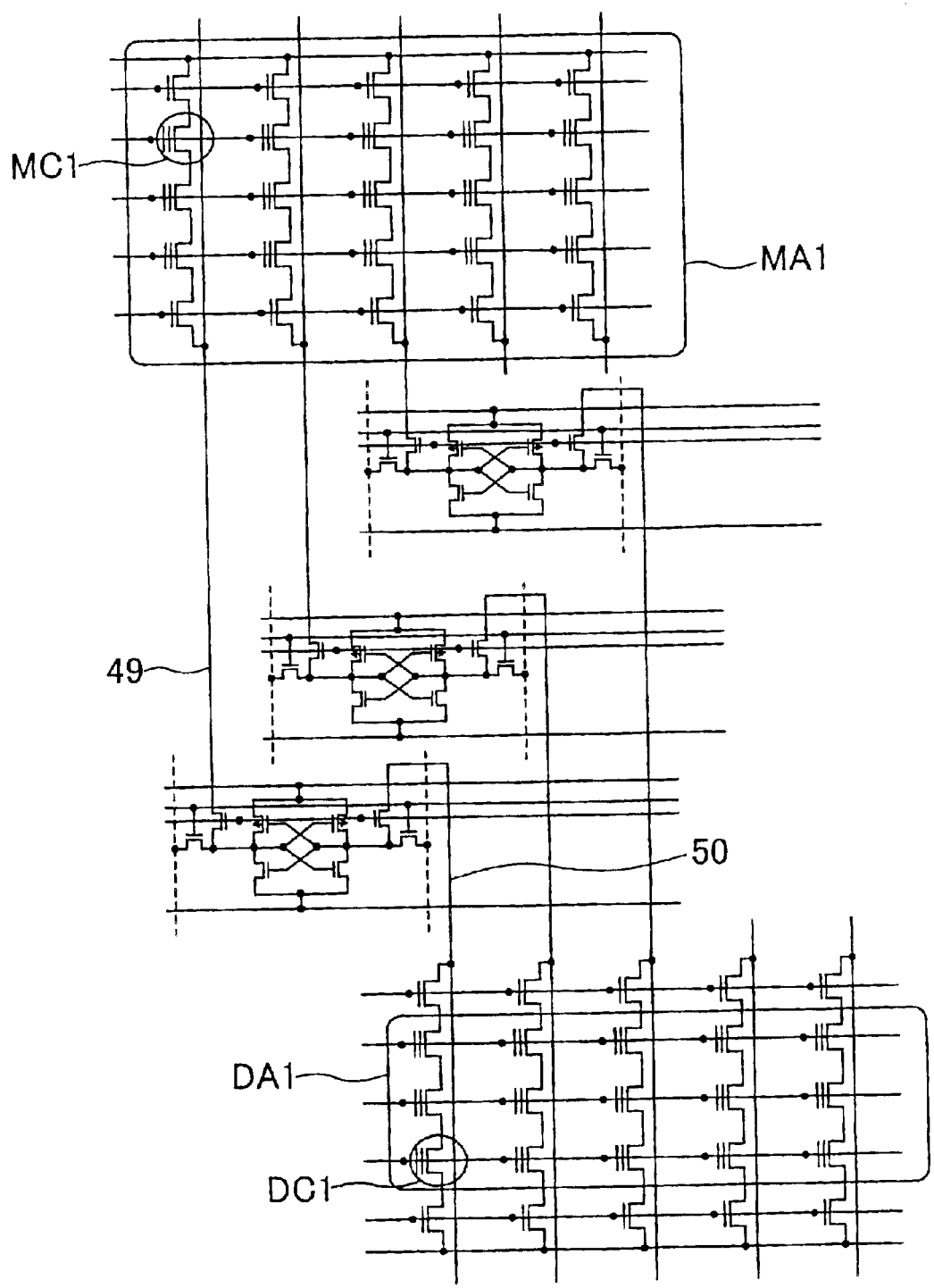
FIG. 17 is a circuit diagram of the memory cell portion of the semiconductor memory device according to the invention.

FIG. 17 is a circuit diagram of the memory cell portion of the fifth embodiment according to the invention. This embodiment has a different interconnection between high-density integrated memory cells and a different interconnection between cell array and sense amplifier. Although the memory cell array is partially shown, a cell array MA1 is repeatedly arranged for the same local data line. The number of cell arrays DA1 to be provided may be smaller than a large number of cell arrays MA1 connected to one sense amplifier, or may be normally only one. In the embodiment 4, a pair of local data lines (for example, 49, 50) connected to the sense amplifier is driven by the same word line, and a read current for the cell in which inverted information is written flows in the local data lines. In this embodiment, a read current for a cell to be driven by different word lines flows in the local data lines. The threshold voltage of the cell array DA1 is set so that an intermediate current between the cases when the stored information in the memory cell is "0" and "1" flows under the voltage condition in which reading operation is made. Therefore, it can be used as a reference at the time of reading, and is a so-called dummy cell. Moreover, as the dummy cell DC1 is used for reading the cell MC1, by using a pair of cells of which the numbers of cells and numbers of transistors forming a bus to the data line are respectively equal, it is possible to make the resistance effects of serially connected transistors uniform, so that stable reading can be expected. Information of 2 bits or above written in the memory cell can be read out by providing a plurality of values for setting of the dummy cell for reading, and by making amplifying operation twice or more.

In this embodiment, not only the memory cell but also the transistors for selecting the array are formed by using polycrystalline silicon on the insulator film. Since arrays are selected by the selection transistors and then connected to the substrate surface, there are a small number of wiring conductors, and thus the layout is easy.

Embodiment 6

Figure 18A:
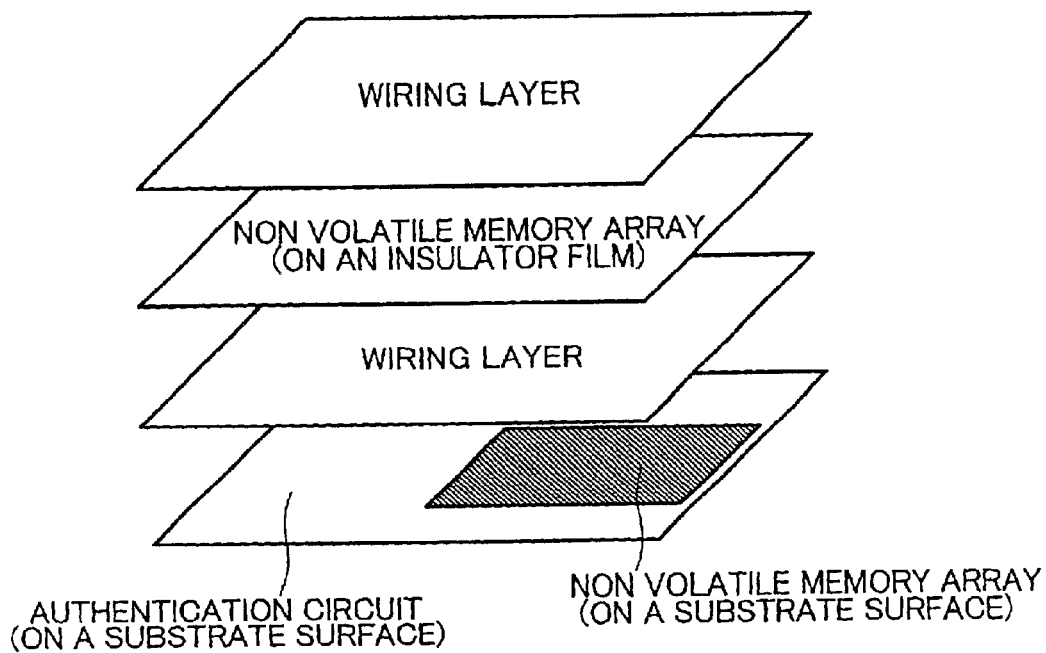
FIGS. 18a and 18b are conceptual diagrams for explaining the construction of the data processor device according to the invention.
Figure 18B:
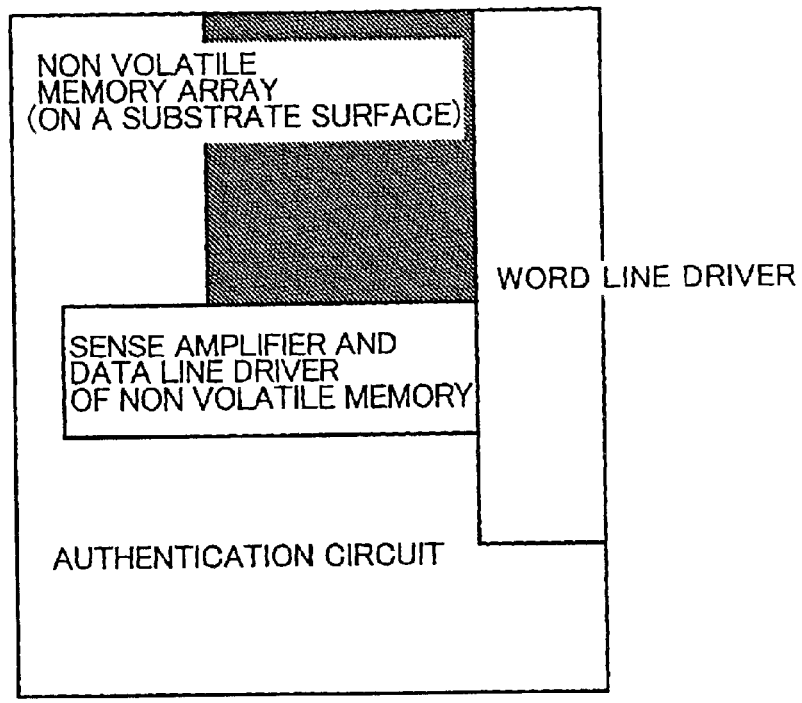

FIGS. 18a and 18b are conceptual diagrams of the construction of a data processor device of the sixth embodiment according to the invention. FIG. 18a shows layers, and FIG. 18b shows the layout of the layers on the substrate surface. As illustrated in FIG. 18a, a nonvolatile memory is formed on the insulator film, and another nonvolatile memory on the substrate surface. At least one wiring conductor layer is provided between these layers.

While flash memories are formed as non-volatile memories on the insulator film and substrate surface in this embodiment, kinds of memories may be used as non-volatile memories. The capacity of the nonvolatile memory on the insulator film is larger than that on the substrate surface. In this embodiment, peripheral circuits such as sense amplifier, data line drive circuit and word line drive circuit are formed on the substrate surface. Since the peripheral circuits for the memory cells on the insulator film are formed on the substrate surface, the chip area can be reduced. Particularly in this embodiment using flash memories, since the word line drive circuit is required to have a high breakdown voltage so that the transistor size becomes large, the area reduction effect is great. Also, since use of shift registers will increase the area, this effect is remarkable. For this effect, there is no need particularly to form a nonvolatile memory on the substrate surface.

The data processor devise of this embodiment can be considered to have an application to holding and authentication of information for requiring secret such as personal information. For example, it is used as carrying means for cyberbuck with personal authentication or as ID card. The authentication information such as password, fingerprint and retina pattern is normally encrypted and stored in a nonvolatile memory. It is feared that such information is illegally read by, for example, applying a probe on the wiring conductor to monitor signals in operation. In this embodiment, the authentication information or authentication program is dispersedly stored in the nonvolatile memories on the substrate surface and insulator film. In order to apply a probe on the conductor of the chip of this embodiment, it is necessary to remove the nonvolatile memory on the insulator film. Since the authentication information or authentication program would be lost, the information could not be obtained. Thus, the data processor device having such layer structure has high safety. Moreover, the same effect can also be achieved by simply storing the authentication information or authentication program in the nonvolatile memory on the insulator film and providing an authentication circuit using such information on the substrate surface. However, the safety of this case is lower than that of this embodiment in which the information is dispersedly stored. In addition, the nonvolatile memory on the insulator film has a large capacity, and thus particularly it can also be used to store general information with no secret.

Embodiment 7

Figure 19A:
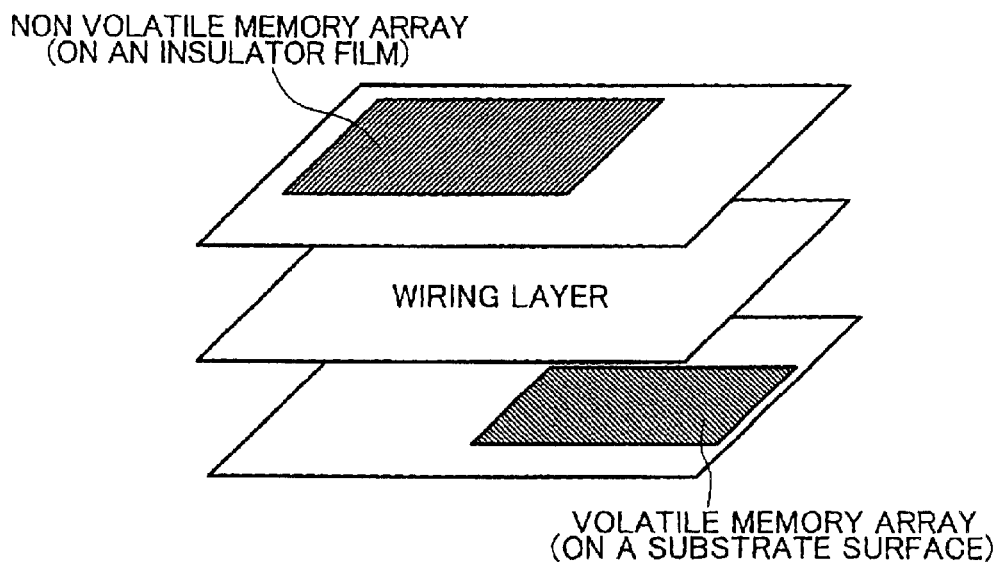
FIGS. 19a and 19b are conceptual diagrams for explaining a method of using the data processor device according to the invention.
Figure 19B:
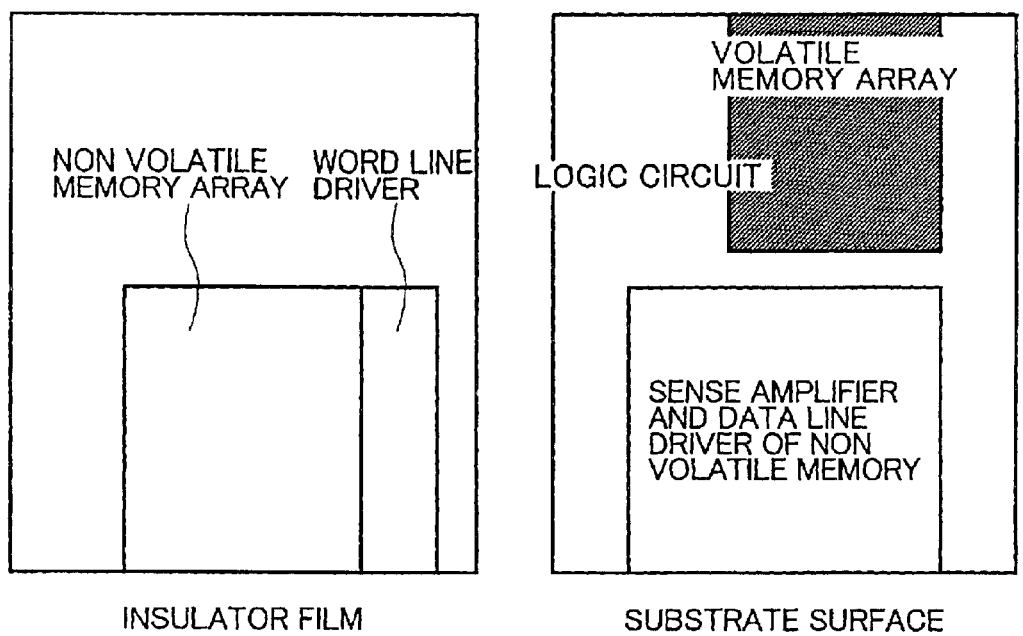

FIGS. 19a and 19b are conceptual diagrams of the construction of a data processor device of the seventh embodiment according to the invention. The cells and circuits in the embodiment 1 are used for the memory cells on the insulator film and the sense circuit on the substrate. The feature of this embodiment is that a volatile memory is further provided on the substrate surface. It is difficult to provide both DRAM and flash memory on the same chip, because the processes for forming the memories are greatly different from each other. According to the construction of this embodiment, only the processes for forming a ligic circuit and a volatile memory on the same substrate can be used to easily achieve the target device. Thus, it is possible to construct on one chip a microprocessor, BIOS storing flash memory, DRAM and hard disk for personal computer. Since the bandwidth of the connection between memories can be increased in addition to the cost reduction effect, fast operation can be performed. Also, since there is no need to provide the input/output circuit, the consumption power can be reduced.

This embodiment employs DRAM using trench capacitor for the volatile memory on the substrate surface, and the flash memory for the nonvolatile memory on the insulator film. The word line drive circuit as well as memory cells is formed on the insulator film by using polycrystalline silicon Therefore, transistors that are resistant to a high voltage of 20 V or above are not necessary to provide on the substrate surface, and thus the chip area can be reduced. The MOS transistors that are resistant to a high voltage need thick gate oxide films. Since those transistors are not necessary to form on the substrate surface, it is possible to reduce the number of different thickness values of the gate oxide films of the transistors on the substrate surface. Moreover, although the peripheral circuits for the nonvolatile memory are formed on an area substantially equal to the area of the nonvolatile memory on the insulator film in this embodiment, the area of the peripheral circuits can be reduced by making the memory mats be not small as in the embodiment 1, but by decreasing the number of sense amplifiers. In this case, since other circuits can be formed in the blank space under the nonvolatile memory on the insulator film, the area can be reduced, leading to low cost. In addition, while the nonvolatile memory is formed on the substrate surface in this embodiment, it may be built on the insulator film so that the volatile memory and nonvolatile memory can be formed on different layers on the insulator film.

Embodiment 8

Figure 20:
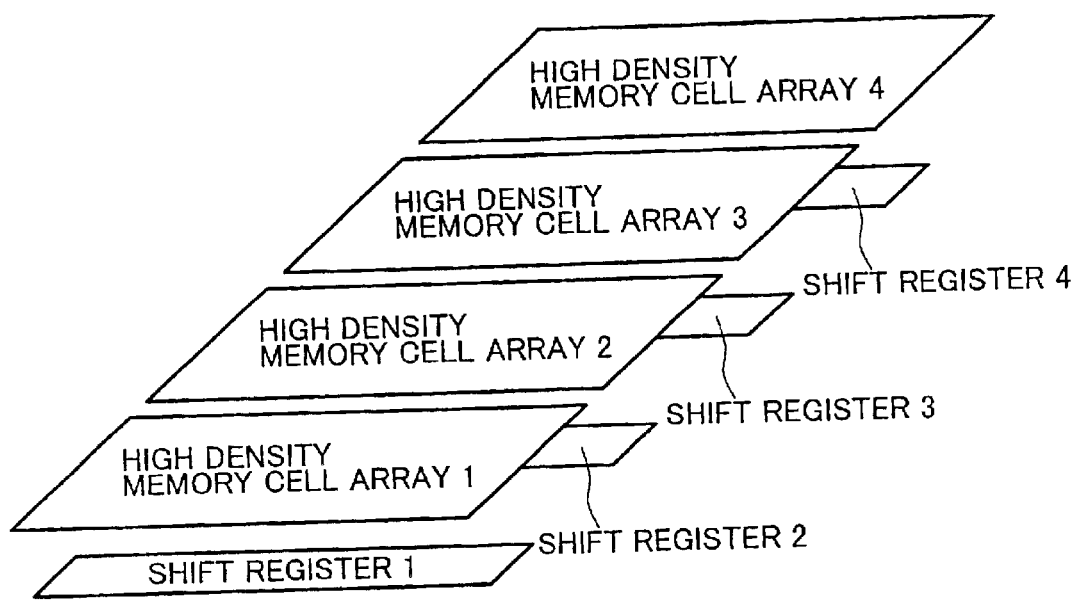
FIG. 20 is a conceptual diagram of the construction of the data processor device according to the invention.

FIG. 20 is a schematic diagram to which reference is made in explaining the construction of the memory cell portion of a memory device of the eighth embodiment according to the invention. This embodiment is a serial access memory device having a shift register provided for each memory mat. Although only four memory mats are shown for the sake of simplicity, this embodiment is actually a high-density integrated memory having 64 M memory cells and 16 divisions of 8 K word lines. The high-density integrated memory portion is flash memory. The 8 Kb units of the input signal from the outside are sequentially allocated to and once stored in different shift registers by a controller. This information is written in the upper flash memory. This writing is finished until the next information is written in the shift registers. Although the writing is made for each cell and thus slow, a fast data transfer rate for writing can be achieved. The verify circuit and reading circuit are provided for each memory mat, so that each memory mat can be independently operated. In general, when two bits or above are stored in unit cell, the interval of the threshold voltage distribution indicative of each information becomes narrow, and thus a high precision verifying is necessary so that it takes a long time to verify. Therefore, the construction of this embodiment is particularly useful. Although the conventional memory having the high-density integrated memory cells and the peripheral circuits formed on the same plane has a great area penalty, the present invention has almost no such defect.

According to the above embodiments, it is possible to provide a semiconductor memory device capable of fast rewriting and being formed on a small area. In addition, it is possible to provide a semiconductor memory device of small-area, large capacity or capable of fast operation and low power consumption operation. Moreover, it is possible to provide a data processor device that can be easily produced, and have a large-scale memory built on one chip without losing the logic performance.

What is claimed is:

1. A semiconductor memory device comprising two or more different types of memory cell arrays formed on a chip, at least two of the different types of said memory cell arrays being formed at different positions to each other in the vertical direction relative to said chip, wherein, when a memory cell array that takes a longer time to rewrite data, as one of said two vertically provided memory cell arrays, transfers its stored data to an external circuit, said stored data is transferred through the other memory cell array to the external circuit.

2. A semiconductor memory device according to claim 1, wherein at least a wiring conductor layer is interposed between said vertically formed memory cell arrays.

3. A semiconductor memory device according to claim 1, wherein data is transferred between said two vertically formed different memory arrays.

4. A semiconductor memory device according to claim 1, wherein one of said two vertically provided memory cell arrays has the function of a sense amplifier for the other memory cell array.

5. A semiconductor memory device comprising two or more different types of memory cell arrays formed on a chip, at least two of the different types of said memory cell arrays being formed at different positions to each other in the vertical direction relative to said chip, wherein the storage capacity of a memory cell array that takes a shorter time to rewrite data, as one of said two vertically provided memory cell arrays, is half that of the other memory cell array.

6. A semiconductor memory device according to claim 5, wherein at least a wiring conductor layer is interposed between said vertically formed memory cell arrays.

7. A semiconductor memory device according to claim 5, wherein data is transferred between said two vertically formed different memory arrays.

8. A semiconductor memory device comprising two or more different types of memory cell arrays formed on a chip, at least two of the different types of said memory cell arrays being formed at different positions to each other in the vertical direction relative to said chip, wherein the upper one of said two vertically provided memory cell arrays does not need refresh operation, the lower one thereof needs refresh operation, and a logic circuit is provided at the same height as is the lower memory cell array.

* * * * *